US009583433B2

(12) United States Patent
Song et al.

(10) Patent No.: US 9,583,433 B2
(45) Date of Patent: Feb. 28, 2017

(54) INTEGRATED DEVICE PACKAGE COMPRISING CONDUCTIVE SHEET CONFIGURED AS AN INDUCTOR IN AN ENCAPSULATION LAYER

(71) Applicant: QUALCOMM Incorporated, San Diego, CA (US)

(72) Inventors: Young Kyu Song, San Diego, CA (US); Hong Bok We, San Diego, CA (US); Kyu-Pyung Hwang, Newton, MA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/631,391

(22) Filed: Feb. 25, 2015

(65) Prior Publication Data

US 2016/0247761 A1  Aug. 25, 2016

(51) Int. Cl.
*H01L 29/66* (2006.01)
*H01L 23/522* (2006.01)
(Continued)

(52) U.S. Cl.
CPC ..... *H01L 23/5227* (2013.01); *H01F 27/2847* (2013.01); *H01F 27/292* (2013.01);
(Continued)

(58) Field of Classification Search
CPC .......... H01L 23/5225–23/5227; H01L 23/645; H01L 27/0288; H01L 28/10;
(Continued)

(56) References Cited

U.S. PATENT DOCUMENTS 2,568,169 A    9/1951  Raczynski
8,258,612 B2   9/2012  Kuan et al.
(Continued)

FOREIGN PATENT DOCUMENTS

EP    0662699 A1     7/1995
EP    1320122 A2     6/2003
WO    WO-2010096213 A2  8/2010

OTHER PUBLICATIONS

International Search Report and Written Opinion—PCT/US2016/019397—ISA/EPO—Jun. 1, 2016.
(Continued)

*Primary Examiner* — Cuong B Nguyen
(74) *Attorney, Agent, or Firm* — Loza & Loza, LLP

(57) ABSTRACT

An integrated device package includes a package substrate, a die coupled to the package substrate, an encapsulation layer encapsulating the die, and at least one sheet of electrically conductive material configured to operate as an inductor. The sheet of electrically conductive material is at least partially encapsulated by the encapsulation layer. The sheet of electrically conductive material is configured to operate as a solenoid inductor. The sheet of electrically conductive material includes a first sheet portion, a second sheet portion coupled to the first sheet portion, where the first sheet portion and the second sheet portion form a first winding of the inductor, a first terminal portion coupled to the first sheet portion, and a second terminal portion coupled to the second sheet portion. The first sheet portion is formed on a first level of the sheet. The second sheet portion is formed on a second level of the sheet.

20 Claims, 16 Drawing Sheets

(51) Int. Cl.
*H01L 23/31* (2006.01)
*H01L 23/48* (2006.01)
*H01L 21/56* (2006.01)
*H01L 49/02* (2006.01)
*H01F 27/28* (2006.01)
*H01F 27/29* (2006.01)
*H01L 23/64* (2006.01)
*H01L 23/498* (2006.01)
*H01L 23/00* (2006.01)

(52) U.S. Cl.
CPC ......... *H01F 41/063* (2016.01); *H01L 21/563* (2013.01); *H01L 23/3114* (2013.01); *H01L 23/481* (2013.01); *H01L 23/645* (2013.01); *H01L 28/10* (2013.01); *H01L 23/3128* (2013.01); *H01L 23/49822* (2013.01); *H01L 24/13* (2013.01); *H01L 24/16* (2013.01); *H01L 2224/131* (2013.01); *H01L 2224/16227* (2013.01); *H01L 2225/1023* (2013.01); *H01L 2225/1041* (2013.01); *H01L 2924/15311* (2013.01)

(58) Field of Classification Search
CPC ..... H01L 2223/6655; H01L 2924/1206; H01L 2924/19042
See application file for complete search history.

(56) References Cited

U.S. PATENT DOCUMENTS

| | | | |
|---|---|---|---|
| 8,518,789 | B2 | 8/2013 | Mi et al. |
| 8,811,027 | B2 | 8/2014 | Kato |
| 2007/0247268 | A1 | 10/2007 | Oya et al. |
| 2008/0054428 | A1* | 3/2008 | Lam ...................... H01L 23/645 |
| | | | 257/686 |
| 2010/0237495 | A1 | 9/2010 | Pagaila et al. |
| 2010/0314741 | A1 | 12/2010 | Lee et al. |
| 2011/0062549 | A1* | 3/2011 | Lin ..................... H01L 23/3128 |
| | | | 257/531 |
| 2014/0203399 | A1 | 7/2014 | Hofmann et al. |
| 2014/0225246 | A1 | 8/2014 | Henderson et al. |

OTHER PUBLICATIONS

Yoon J-B., et al., "High-Performance Electroplated Solenoid-Type Integrated Inductor (S12) for RF Applications Using Simple 3D Surface Micromachining Technology," International Electron Devices Meeting, 1998, IEDM Technical Digest, San Francisco, CA, Dec. 6-9, 1998; [International Electron Devices Meeting], New York, NY : IEEE, US, Dec. 6, 1998 (Dec. 6, 1998), pp. 544-547, XP000859432, ISBN: 978-0-78003-4775-5.

* cited by examiner

PROFILE VIEW

PLAN VIEW

PROFILE VIEW

PLAN VIEW

INTEGRATED DEVICE PACKAGE COMPRISING CONDUCTIVE SHEET CONFIGURED AS AN INDUCTOR IN AN ENCAPSULATION LAYER

BACKGROUND

Field

Various features relate to an integrated device package that includes a conductive sheet configured as an inductor in an encapsulation layer.

Background

FIG. 1 illustrates an integrated device package 100 that includes a first die 102 and a package substrate 106. The package substrate 106 includes a dielectric layer and a plurality of interconnects 110. The package substrate 106 is a laminated substrate. The plurality of interconnects 110 includes traces, pads and/or vias. The first die 102 is coupled to the package substrate 106 through the first set of solder balls 112. The package substrate 106 is coupled to a printed circuit board (PCB) 108 through the second set of solder balls 116. FIG. 1 illustrates that an inductor 120 is mounted on the PCB 108. The inductor 120 is located externally of the integrated device package 100, and takes up a lot real estate on the PCB 108.

One drawback of the inductor 120 shown in FIG. 1 is that it creates a device with a form factor that may be too large for the needs of mobile computing devices and/or wearable computing devices. This may result in a device that is either too large and/or too thick. That is, the combination of the integrated device package 100, the inductor 120 and the PCB 108 shown in FIG. 1 may be too thick and/or have a surface area that is too large to meet the needs and/or requirements of mobile computing devices and/or wearable computing devices.

Therefore, there is a need for an integrated device package with a better form factor, while at the same time meeting the needs and/or requirements of mobile computing devices and/or wearable computing devices.

SUMMARY

Various features relate to an integrated device package that includes a conductive sheet configured as an inductor in an encapsulation layer.

A first example provides an integrated device package that includes a package substrate, a die coupled to the package substrate, an encapsulation layer encapsulating the die, and at least one sheet of electrically conductive material configured to operate as an inductor, where the at least one sheet of electrically conductive material is at least partially encapsulated by the encapsulation layer.

A second example provides a method for fabricating an integrated device package. The method provides a package substrate. The method couples a die to the package substrate. The method couples at least one sheet of electrically conductive material to the package substrate, where the at least one sheet of electrically conductive material is formed to operate as an inductor. The method forms an encapsulation layer that at least partially encapsulates the die and the at least one sheet of electrically conductive material.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

An integrated device package includes a package substrate, a die coupled to the package substrate, an encapsulation layer encapsulating the die, and at least one sheet of electrically conductive material configured to operate as an inductor. The sheet of electrically conductive material is at least partially encapsulated by the encapsulation layer. In some implementations, the sheet of electrically conductive material may be configured to operate as a solenoid inductor. The sheet of electrically conductive material includes a first sheet portion and a second sheet portion coupled to the first sheet portion. The first sheet portion and the second sheet portion form a first winding of the inductor. The sheet of electrically conductive material also includes a first terminal portion coupled to the first sheet portion, and a second terminal portion coupled to the second sheet portion. The first sheet portion is formed on a first level of the sheet, and the second sheet portion is formed on a second level of the sheet.

Figure 1:
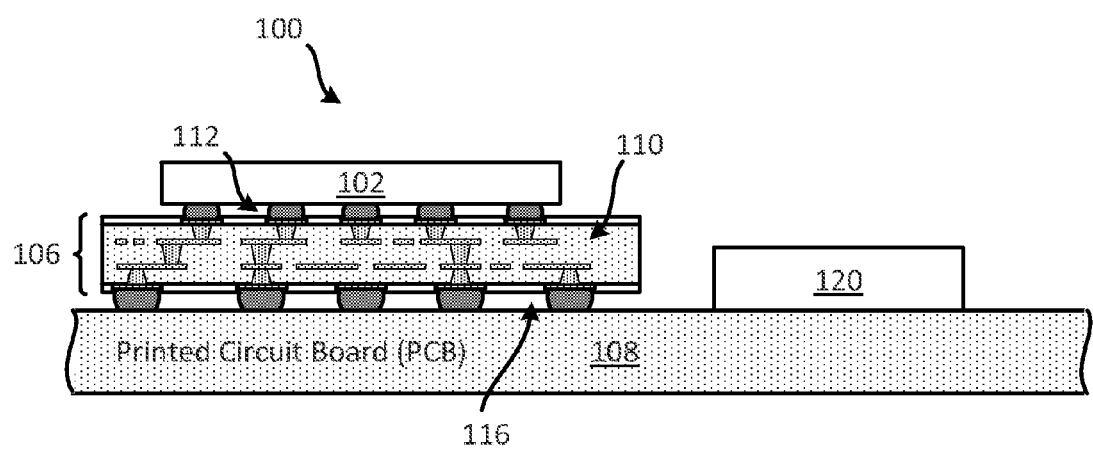
FIG. 1 illustrates an integrated device package.
Figure 2:
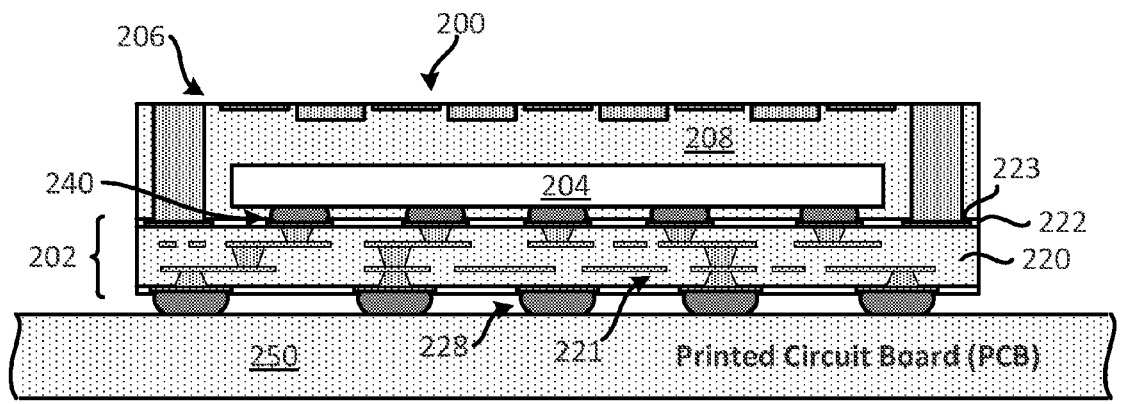
FIG. 2 illustrates a profile view of an example of an integrated device package that includes a conductive sheet configured as an inductor in an encapsulation layer.

Exemplary Integrated Device Package Comprising Sheet of Conductive Material Configured as an Inductor FIG. 2 illustrates an example of an integrated device package that includes a conductive sheet configured to operate as an inductor in an encapsulation layer. Specifically, FIG. 2 illustrates an example of an integrated device package 200 that includes a substrate 202, a die 204, a sheet 206, and an encapsulation layer 208. The substrate 202 may be a package substrate and/or an interposer. The die 204 is coupled (e.g., mounted) to the substrate 202. More specifically, the die 204 is coupled to the substrate 202 through a first set of solder balls 240. In some implementations, the die 204 may be coupled to the substrate 202 differently. For example, the die 204 may be coupled to the substrate 202 through pillars and/or solder.

The sheet 206 is coupled to the substrate 202. The sheet 206 may be at least one sheet of electrically conductive material formed and/or configured to operate as an inductor. The inductor may include a set of windings. The inductor may be a solenoid inductor. The sheet 206 and an inductor are described in further detail below in FIG. 3.

The encapsulation layer 208 at least partially encapsulates the die 204 and the sheet 206. The encapsulation layer 208 may include one of at least a mold and/or an epoxy fill. In some implementations, the encapsulation layer 208 may be a litho-patternable layer. A litho-patternable layer/material is a material that is photo etchable. That is, the litho-patternable layer/material is made of a material that can be etched and/or removed (e.g., through a lithography process) through the exposure of the material to a light source (e.g., ultraviolet (UV) light) through a mask (e.g., photomask).

As shown in FIG. 2, the substrate 202 includes at least one dielectric layer 220, several interconnects 221 (e.g., traces, pads, vias), a solder resist layer 222, and a pad 223. An interconnect is an element or component of a device (e.g., integrated device, integrated device package, die) and/or a base (e.g., package substrate, printed circuit board, interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that provides an electrical path for a signal (e.g., data signal, ground signal, power signal). An interconnect may include more than one element/component. A set of interconnects may include one or more interconnects. FIG. 2 further illustrates that the pad 223 is coupled to the sheet 206. The pad 223 is a form of an interconnect. In some implementations, the pad 223 is coupled to the sheet 206 through an electrically conductive bonding material.

FIG. 2 further illustrates that the integrated device package 200 is coupled (e.g., mounted) on a printed circuit board (PCB) 250 through a second set of solder balls 228. More specifically, the substrate 202 of the integrated device package 200 is coupled to the PCB 250 through the second set of solder balls 228. In some implementations, the integrated device package 200 may be coupled to the PCB 250 differently.

Figure 3:
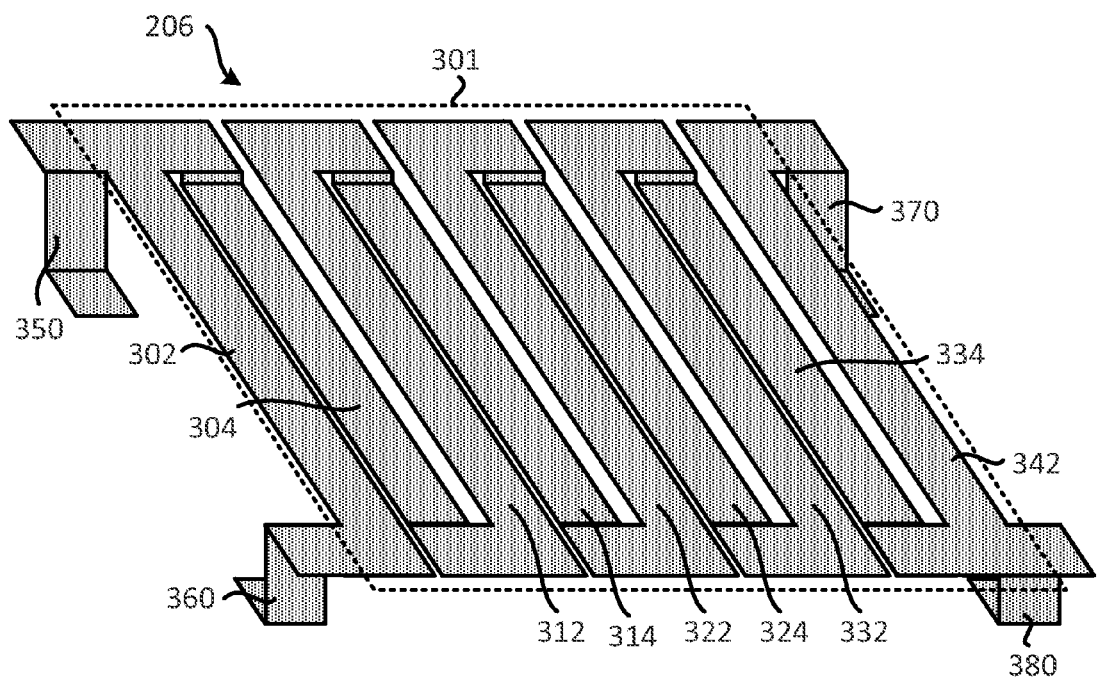
FIG. 3 illustrates an angled view of a conductive sheet configured as an inductor.

FIG. 3 illustrates an angled view of the sheet 206. The sheet 206 may be one or more sheets comprising an electrically conductive material formed or configured to operate as an inductor. The sheet 206 may have a thickness of about 10 microns (μm) or less in some implementations. The sheet 206 may include an inductive portion 301. The inductive portion 301 of the sheet 206 may be formed and/or configured to operate as an inductor (e.g., inductive means). In some implementations, the inductive portion 301 of the sheet 206 may be formed and/or configured to operate as a solenoid inductor (e.g., solenoid inductive means).

The inductive portion 301 includes a first sheet portion 302, a second sheet portion 304, a third sheet portion 312, a fourth sheet portion 314, a fifth sheet portion 322, a sixth sheet portion 324, a seventh sheet portion 332, an eighth sheet portion 334, and a ninth sheet portion 342. In some implementations, some or all of the first sheet portion 302, the second sheet portion 304, the third sheet portion 312, the fourth sheet portion 314, the fifth sheet portion 322, the sixth sheet portion 324, the seventh sheet portion 332, the eighth sheet portion 334, and/or the ninth sheet portion 342 are formed and/or configured to operate as an inductor (e.g., solenoid inductor).

The first sheet portion 302 is coupled to the second sheet portion 304. The second sheet portion 304 is coupled to the third sheet portion 312. The third sheet portion 312 is coupled to the fourth sheet portion 314. The fourth sheet portion 314 is coupled to the fifth sheet portion 322. The fifth sheet portion 322 is coupled to the sixth sheet portion 324. The sixth sheet portion 324 is coupled to the seventh sheet portion 332. The seventh sheet portion 332 is coupled to the eighth sheet portion 334. The eighth sheet portion 334 is coupled to the ninth sheet portion 342.

The first sheet portion 302, the third sheet portion 312, the fifth sheet portion 322, the seventh sheet portion 332, and the ninth sheet portion 342 may be formed by a first level (e.g., upper level) of the sheet 206. The second sheet portion 304, the fourth sheet portion 314, the sixth sheet portion 324, and the eighth sheet portion 334 are formed by a second level (e.g., lower level) of the sheet 206.

The first sheet portion 302 and the second sheet portion 304 may form a first winding of an inductor. The third sheet portion 312 and the fourth sheet portion 314 may form a second winding of the inductor. The fifth sheet portion 322 and the sixth sheet portion 324 may form a third winding of the inductor. The seventh sheet portion 332 and the eighth sheet portion 334 may form a fourth winding of the inductor.

FIG. 3 also illustrates that the sheet 206 includes a first terminal portion 350, a second terminal portion 360, a third terminal portion 370, and a fourth terminal portion 380. The first terminal portion 350 and the second terminal portion 360 may be coupled to the first sheet portion 302. The third terminal portion 370 and the fourth terminal portion 380 may be coupled to the ninth sheet portion 342. In some implementations, one or more of the terminal portions of the sheet 206 may be coupled to the substrate 202 (e.g., may be coupled to an interconnect of the substrate 202). For example, the second terminal portion 360 of the sheet 206 may be coupled to the pad 223 of the substrate 202. In some implementations, an electrically conductive bonding material is used to couple one or more terminal portions to the substrate 202 (e.g., to a pad of the substrate 202).

It is noted that a portion (e.g., second sheet portion 304, first terminal portion 350) of the sheet 206 may include vertical portions, horizontal portions, non-vertical portions (e.g., diagonal portions), non-horizontal portions (e.g., diagonal portions), angled portions of the sheet 206.

The sheet 206 that includes the inductive portion 301 that is formed and/or configured to operate as an inductor (e.g., solenoid inductor) provides several technical advantages. First, the sheet 206 that includes the inductive portion 301 formed to operate as an inductor provides a low profile inductor that can be implemented in an integrated device package. Such a sheet takes up very little real estate in an integrated device package, enabling very small form factor integrated device packages and/or low profile integrated device packages. Second, the sheet 206 with the inductive portion 301 provides a very low cost or cost efficient inductor in an integrated device package. Third, the exemplary design of the inductive portion 301 provides an inductor with a comparably high inductance and/or high quality (Q) factor inductor that can be implemented in an integrated device package. For example, in some implementations, a sheet 206 that is roughly about 4 millimeter (mm)×5.4 millimeter (mm), and has a thickness of about 10 microns (μm) or less, may provide an inductor with an inductance of about 10 nanohenry (nH) or greater. However, different designs, shapes, and sizes of the sheet 206 may provide an inductor with different inductances.

It is noted that FIG. 3 illustrates an example of a sheet of an electrically conductive material formed and/or configured to operate as an inductor. However, different embodiments may use one or more sheets with different shapes, configurations, and/or arrangements. For example, different implementations may include a different number of windings, a different number of terminal portions, and/or portions with different dimensions (e.g., different length, different width). Also, different implementations may form different angles for different portions of the sheet (e.g., perpendicular angles, diagonal angles, 45 degree angles).

The different portions of the sheet 206 may be formed through a stamping process that removes, bends, forms and/or shapes one or more sheets into a particular shape, configuration, and/or arrangement. An example of a process for fabricating the sheet 206 is described in further detail below in at least FIGS. 6 and 7.

Figure 4:
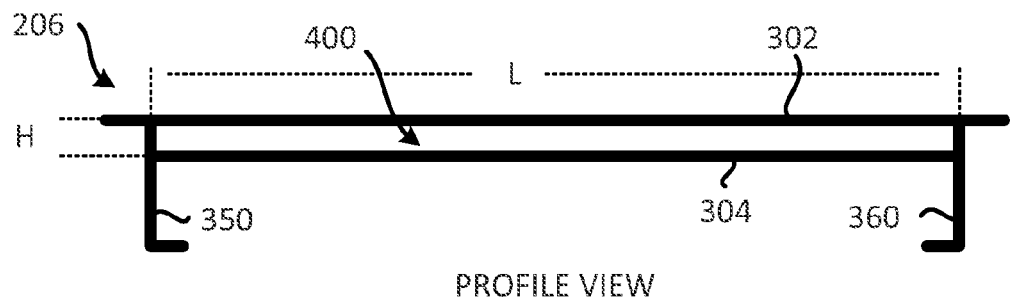
FIG. 4 illustrates a profile view of a conductive sheet configured as an inductor.

FIG. 4 illustrates another profile view of the sheet 206. As shown in FIG. 4, the sheet 206 includes the first sheet portion 302, the second sheet portion 304, the first terminal portion 350, and the second terminal portion 360. An inductor includes the first sheet portion 302 and the second sheet portion 304. An inner area 400 of the inductor may be defined by the space between first sheet portion 302 and the second sheet portion 304. The aperture ratio of an inductor may be defined by the ratio of the smallest dimension (e.g., smallest diameter) of the inner area 400 of the inductor and the biggest dimension (e.g., biggest diameter) of the inner area 400 of the inductor. In FIG. 4, the inductor has a length (L) and a height (H), and the length (L) is greater than the height (H). However, different implementations may have different values for the length (L) and the height (H). In some implementations, the aperture ratio of the inductor, defined by the space between first sheet portion 302 and the second sheet portion 304, is H:L, where L is greater than H. In some implementations, the aperture ratio of the inductor is about 1:2 or less (e.g., 1:5).

Figure 5:
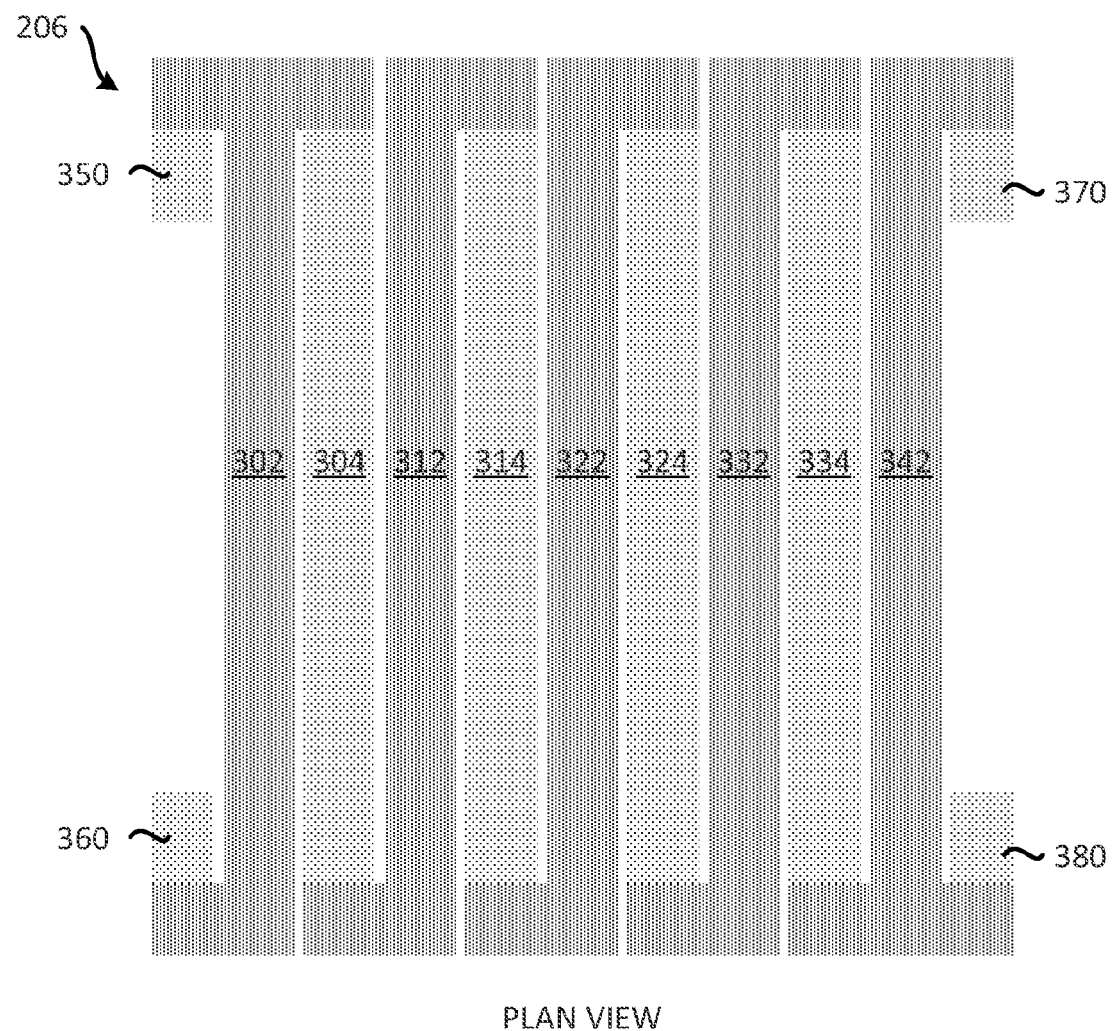
FIG. 5 illustrates a plan view (e.g., top view) of a conductive sheet configured as an inductor.

FIG. 5 illustrates a plan view (e.g., top view) of the sheet 206. As shown in FIG. 5, the sheet 206 includes the first sheet portion 302, the second sheet portion 304, the third sheet portion 312, the fourth sheet portion 314, the fifth sheet portion 322, the sixth sheet portion 324, the seventh sheet portion 332, the eighth sheet portion 334, the ninth sheet portion 342, the first terminal portion 350, the second terminal portion 360, the third terminal portion 370, and/or the fourth terminal portion 380, as previously mentioned above.

Figure 6:
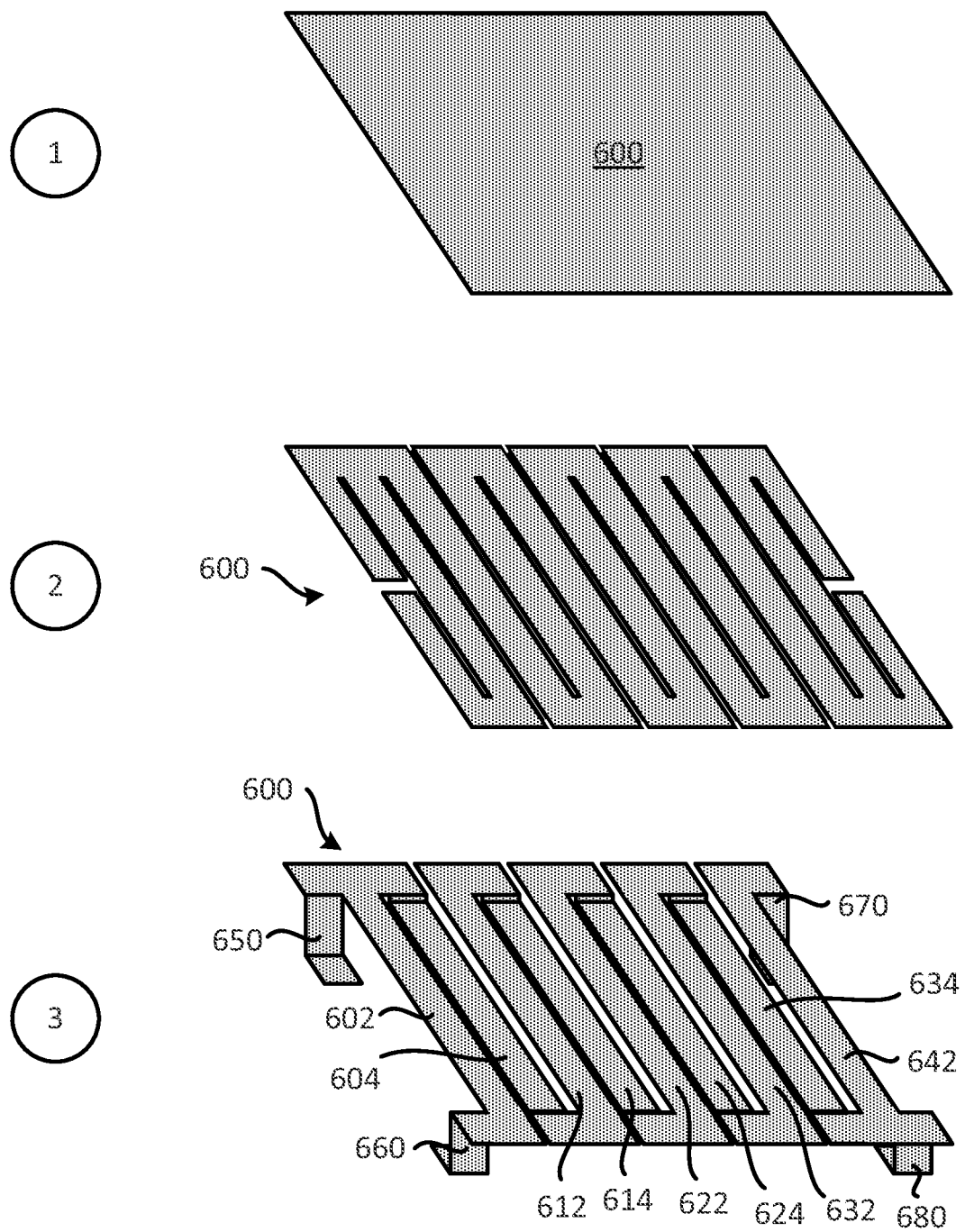
FIG. 6 illustrates an exemplary sequence for providing/fabricating a conductive sheet configured as an inductor.

Exemplary Sequence for Providing/Fabricating an Integrated Device Package Comprising Sheet of Conductive Material Configured as an Inductor In some implementations, providing/fabricating an integrated device package that includes a sheet of electrically conductive material configured as an inductor includes several processes. FIG. 6 illustrates an exemplary sequence for providing/fabricating an integrated device package that includes a sheet of electrically conductive material configured as an inductor. In some implementations, the sequence of FIG. 6 may be used to provide/fabricate the sheet 206 of FIGS. 2-5 and/or other sheet described in the present disclosure. However, for the purpose of simplification, FIG. 6 will be described in the context of providing/fabricating the sheet 206 of FIG. 3.

It should be noted that the sequence of FIG. 6 may combine one or more stages in order to simplify and/or clarify the sequence for providing/fabricating a sheet configured to operate as an inductor. In some implementations, the order of the processes may be changed or modified.

Stage 1 illustrates a state after a sheet 600 is provided. The sheet 600 may be one or more sheets. The sheet 600 is made of a malleable (e.g., non-brittle) material. The sheet 600 is made of a material that may be shaped, bent, folded, stretched, etc. . . . with mechanical force or stress, without the material breaking and/or cracking. The sheet 600 may be a sheet of electrically conductive material. For example, the sheet 600 may include one or more sheets of metal (e.g., copper). In some implementations, the sheet 600 may have a thickness that is about 10 microns (μm) or less.

Stage 2 illustrates a state after the sheet 600 is patterned. That is, stage 2 illustrates a state after some portions of the sheet 600 are removed. Different implementations may remove portions of the sheet 600 differently. For example, a laser may be used to cut and pattern the sheet 600. In another example, a photo-lithography process (e.g., photo-etching process) may be used to etch and pattern the sheet 600. In yet another example, a press and/or stamping process may be use to cut and pattern the sheet. In some implementations, a combination of two or more of the above processes may be used to pattern the sheet 600. Different implementations may pattern the sheet 600 with different shapes and sizes.

Stage 3 illustrates a state after the patterned sheet 600 is stamped and/or pressed to create a sheet with different portions and different levels. That is, some portions of the patterned sheet 600 are stamped and/or pressed to form a sheet configured to operate as an inductor (e.g., solenoid inductor). Some portions of the patterned sheet 600 may be pressed upwards, while other portions of the patterned sheet 600 may be pressed downwards. Some portions may not be pressed. The process of stamping and/or pressing the sheet 600 creates different portions or regions in the sheet 600. These portions may have different angles and/or alignment. For example, the stamping and/or process may create portions that are vertical, horizontal, non-vertical (e.g., diagonal), and/or non-horizontal (e.g., diagonal). In some implementations, the patterned and stamped sheet 600 is similar to the sheet 206 of FIG. 3.

Stage 3 illustrates that the sheet 600 includes a first sheet portion 602, a second sheet portion 604, a third sheet portion 612, a fourth sheet portion 614, a fifth sheet portion 622, a sixth sheet portion 624, a seventh sheet portion 632, an eighth sheet portion 634, and a ninth sheet portion 642. In some implementations, some or all of the first sheet portion 602, the second sheet portion 604, the third sheet portion 612, the fourth sheet portion 614, the fifth sheet portion 622, the sixth sheet portion 624, the seventh sheet portion 632, the eighth sheet portion 634, and/or the ninth sheet portion 642 are formed and/or configured to operate as an inductor (e.g., solenoid inductor).

The first sheet portion 602, the third sheet portion 612, the fifth sheet portion 622, the seventh sheet portion 632, and the ninth sheet portion 642 may be formed by a first level (e.g., upper level) of the sheet 600. The second sheet portion 604, the fourth sheet portion 614, the sixth sheet portion 624, and the eighth sheet portion 634 are formed by a second level (e.g., lower level) of the sheet 600.

The first sheet portion 602 and the second sheet portion 604 may form a first winding of an inductor. The third sheet portion 612 and the fourth sheet portion 614 may form a second winding of the inductor. The fifth sheet portion 622 and the sixth sheet portion 624 may form a third winding of the inductor. The seventh sheet portion 632 and the eighth sheet portion 634 may form a fourth winding of the inductor.

FIG. 6 also illustrates that the sheet 600 includes a first terminal portion 650, a second terminal portion 660, a third terminal portion 670, and a fourth terminal portion 680. The first terminal portion 650 and the second terminal portion 660 may be coupled to the first sheet portion 602. The third terminal portion 670 and the fourth terminal portion 680 may be coupled to the ninth sheet portion 642.

Figure 7:
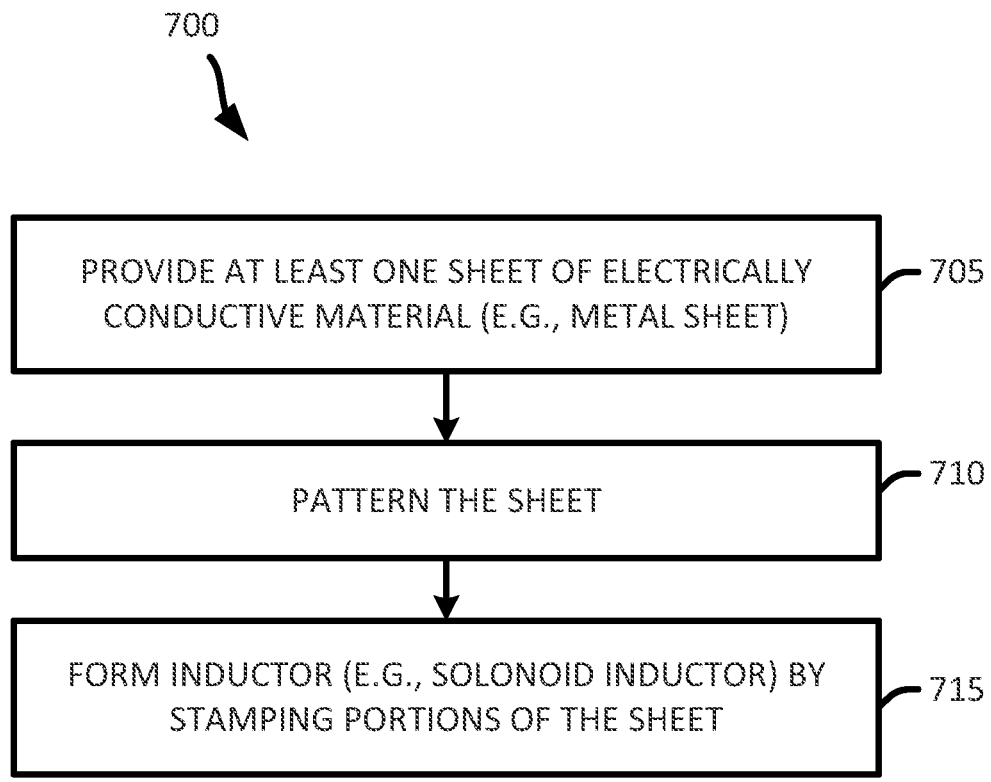
FIG. 7 illustrates an exemplary flow diagram of a method for providing/fabricating a conductive sheet configured as an inductor.

Exemplary Flow Diagram of a Method for Providing/Fabricating an Integrated Device Package Comprising Sheet of Conductive Material Configured as an Inductor FIG. 7 illustrates an exemplary flow diagram of a method 700 for providing/fabricating an integrated device package that includes a sheet of electrically conductive material configured as an inductor. In some implementations, the method 700 of FIG. 7 may be used to provide/fabricate the sheet of FIGS. 2-5 and/or other sheets configured to operate as an inductor in the present disclosure.

It should be noted that the flow diagram of FIG. 7 may combine one or more step and/or processes in order to simplify and/or clarify the method for providing a sheet configured to operate as an inductor. In some implementations, the order of the processes may be changed or modified.

The method provides (at 705) at least one sheet of electrically conductive material. The sheet is made of a malleable (e.g., non-brittle) material. The sheet is made of a material that may be shaped, bent, folded, stretched, etc. . . . with mechanical force or stress, without the material breaking and/or cracking. The sheet may include one or more sheets of metal (e.g., copper). In some implementations, the sheet may have a thickness that is about 10 microns (μm) or less. In some implementations, providing the sheet includes fabricating the sheet. In some implementations, providing the sheet includes receiving at least one sheet from a supplier.

The method patterns (at 710) the sheet. In some implementations, patterning the sheet includes removing portions of the sheet. Different implementations may remove portions of the sheet 600 differently. For example, a laser may be used to cut and pattern the sheet. In another example, a photo-etching process may be use to etch and pattern the sheet. In yet another example, a press and/or stamping process may be use to cut and pattern the sheet. In some implementations, a combination of two or more of the above processes may be used to pattern the sheet.

The method forms (at 715) an inductor by stamping (e.g., pressing) portions of the patterned sheet. That is, some portions of the patterned sheet are stamped and/or pressed to form sheet portions configured to operate as an inductor. In some implementations, some portions of the patterned are stamped and/or pressed to form sheet portions configured to operate as a solenoid inductor.

Figure 8:
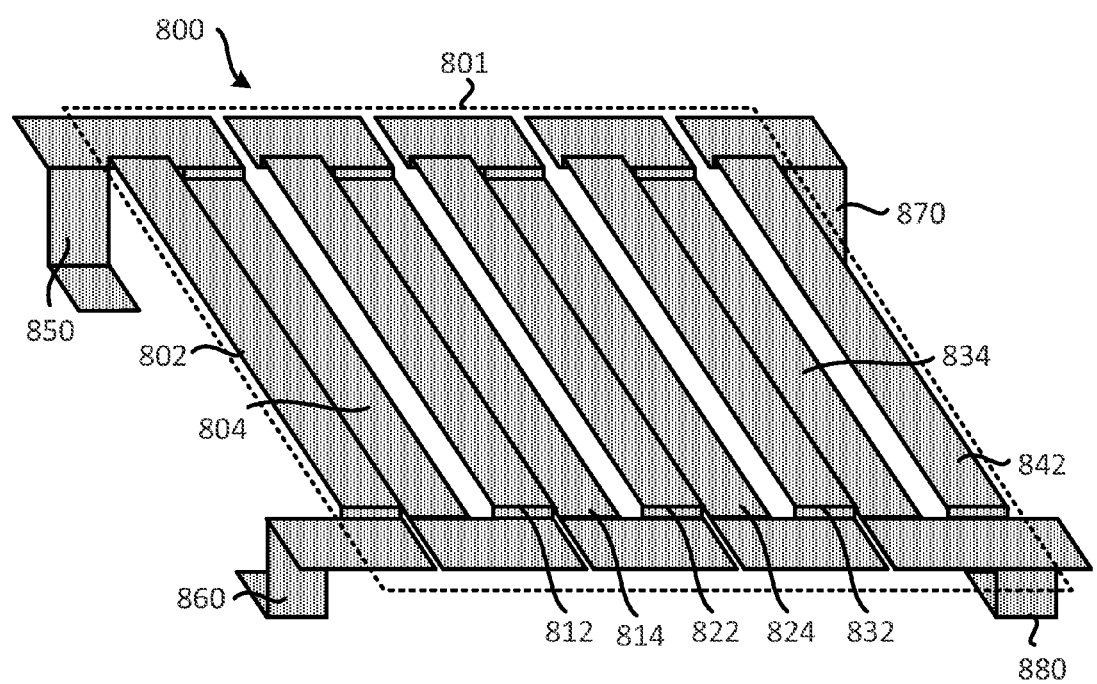
FIG. 8 illustrates an angled view of a conductive sheet configured as another inductor.

Exemplary Integrated Device Package Comprising Sheet of Conductive Material Configured as an Inductor A sheet of conductive material configured to operate as an inductor may have different shapes and designs. FIG. 3 above, illustrates one example of a sheet of conductive material configured to operate as an inductor. FIG. 8 illustrates another example of a sheet 800 configured to operate as an inductor. The sheet 800 of FIG. 8 is similar to the sheet 206 of FIG. 3, except that some portions of the sheet 800 are located on different levels.

The sheet 800 may be one or more sheets comprising an electrically conductive material formed or configured to operate as an inductor. The sheet 800 may have a thickness of about 10 microns (μm) or less in some implementations. The sheet 800 may include an inductive portion 801. The inductive portion 801 of the sheet 800 may be configured to operate as an inductor (e.g., inductive means). In some implementations, the inductive portion 801 of the sheet 800 may be configured to operate as a solenoid inductor (e.g., solenoid inductive means).

The inductive portion 801 includes a first sheet portion 802, a second sheet portion 804, a third sheet portion 812, a fourth sheet portion 814, a fifth sheet portion 822, a sixth sheet portion 824, a seventh sheet portion 832, an eighth sheet portion 834, and a ninth sheet portion 842. In some implementations, some or all of the first sheet portion 802, the second sheet portion 804, the third sheet portion 812, the fourth sheet portion 814, the fifth sheet portion 822, the sixth sheet portion 824, the seventh sheet portion 832, the eighth sheet portion 834, and/or the ninth sheet portion 842 are formed and/or configured to operate as an inductor (e.g., solenoid inductor).

The first sheet portion 802 is coupled to the second sheet portion 804. The second sheet portion 804 is coupled to the third sheet portion 812. The third sheet portion 812 is coupled to the fourth sheet portion 814. The fourth sheet portion 814 is coupled to the fifth sheet portion 822. The fifth sheet portion 822 is coupled to the sixth sheet portion 824. The sixth sheet portion 824 is coupled to the seventh sheet portion 832. The seventh sheet portion 832 is coupled to the eighth sheet portion 834. The eighth sheet portion 834 is coupled to the ninth sheet portion 842.

The first sheet portion 802, the third sheet portion 812, the fifth sheet portion 822, the seventh sheet portion 832, and the ninth sheet portion 842 may be formed by a first level (e.g., upper level, raised level) of the sheet 800. In some implementations, the first sheet portion 802, the third sheet portion 812, the fifth sheet portion 822, the seventh sheet portion 832, and the ninth sheet portion 842 may be formed by pressing upwards respective portions of the sheet 800.

The second sheet portion 804, the fourth sheet portion 814, the sixth sheet portion 824, and the eighth sheet portion 834 are formed by a second level (e.g., lower level) of the sheet 800. In some implementations, the second sheet portion 804, the fourth sheet portion 814, the sixth sheet portion 824, and the eighth sheet portion 834 are formed by pressing downwards respective portions of the sheet 800.

The first sheet portion 802 and the second sheet portion 804 may form a first winding of an inductor. The third sheet portion 812 and the fourth sheet portion 814 may form a second winding of the inductor. The fifth sheet portion 822 and the sixth sheet portion 824 may form a third winding of the inductor. The seventh sheet portion 832 and the eighth sheet portion 834 may form a fourth winding of the inductor.

FIG. 8 also illustrates that the sheet 800 includes a first terminal portion 850, a second terminal portion 860, a third terminal portion 870, and a fourth terminal portion 880. The first terminal portion 850 and the second terminal portion 860 may be coupled to the first sheet portion 802. The third terminal portion 870 and the fourth terminal portion 880 may be coupled to the ninth sheet portion 842. In some implementations, one or more of the terminal portions of the sheet 800 may be coupled to the substrate 202. For example, the second terminal portion 860 of the sheet 800 may be coupled to the pad 223 of the substrate 202. In some implementations, an electrically conductive bonding material is used to couple one or more terminal portions to the substrate 202 (e.g., to a pad of the substrate 202).

Figure 9:
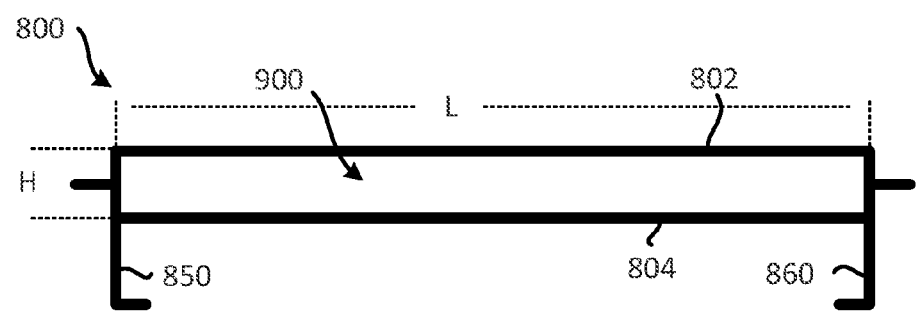
FIG. 9 illustrates a profile view of a conductive sheet configured as another inductor.

FIG. 9 illustrates another profile view of the sheet 800. As shown in FIG. 9, the sheet 800 includes the first sheet portion 802, the second sheet portion 804, the first terminal portion 850, and the second terminal portion 860. An inductor includes the first sheet portion 802 and the second sheet portion 804. An inner area 900 of the inductor may be defined by the first sheet portion 802 and the second sheet portion 804. The inner area 900 of FIG. 9 is greater than the inner area 400 of FIG. 4. As previously mentioned, the aperture ratio of an inductor may be defined by the ratio of the smallest dimension (e.g., smallest diameter) of the inner area 900 of the inductor and the biggest dimension (e.g., biggest diameter) of the inner area 900 of the inductor. In FIG. 9, the inductor has a length (L) and a height (H), and the length (L) is greater than the height (H). However, different implementations may have different values for the length (L) and the height (H). In some implementations, the aperture ratio of the inductor, defined by the space between the first sheet portion 802 and the second sheet portion 804, is H:L, where L is greater than H. In some implementations, the aperture ratio of the inductor is about 1:2 or less (e.g., 1:5).

Figure 10:
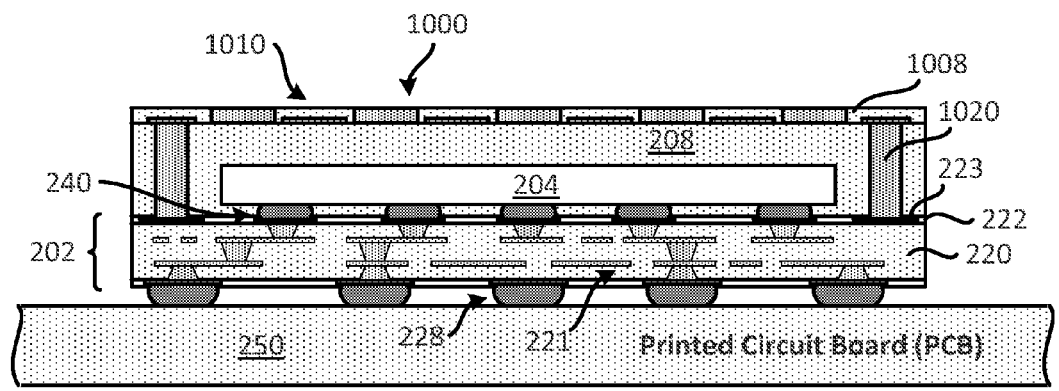
FIG. 10 illustrates a profile view of an example of an integrated device package that includes a conductive sheet configured as an inductor in an encapsulation layer.

Exemplary Integrated Device Package Comprising Sheet of Conductive Material Configured as an Inductor FIG. 10 illustrates another example of an integrated device package that includes a conductive sheet configured to operate as an inductor in an encapsulation layer. FIG. 10 is similar to FIG. 2, except that FIG. 10 illustrates a through encapsulation via and a conductive sheet coupled to the through encapsulation via. The conductive sheet of FIG. 10 may have a different configuration and/or arrangement than the conductive sheet described in FIG. 2.

Specifically, FIG. 10 illustrates an example of an integrated device package 1000 that includes the substrate 202, the die 204, a sheet 1010, the encapsulation layer 208, an encapsulation layer 1008, and at least one through encapsulation via 1020. The substrate 202 may be a package substrate and/or an interposer. The die 204 is coupled (e.g., mounted) to the substrate 202.

The encapsulation layer 208 at least partially encapsulates the die 204. The encapsulation layer 208 may include one of at least a mold and/or an epoxy fill. In some implementations, the encapsulation layer 208 may be a litho-patternable layer. The through encapsulation via 1020 traverses the encapsulation layer 208. The through encapsulation via 1020 is coupled to the substrate 202. More specifically, the through encapsulation via 1020 is coupled to the pad 223 on the substrate 202. In some implementations, each encapsulation via 1020 may be coupled to a particular interconnect (e.g., pad) of the substrate 202.

The sheet 1010 is coupled to the via 1020. The sheet 1010 may be at least one sheet of conductive material formed and/or configured to operate as an inductor. The inductor may include a set of windings. The inductor may be a solenoid inductor. The sheet 1010 and an inductor are described in further detail below in FIG. 11.

The encapsulation layer 1008 at least partially encapsulates the sheet 1010. Thus, in some implementations, portions of the sheet 1010 may be exposed (e.g., not covered by the encapsulation layer 1008). In some implementations, the encapsulation layer 1008 and the encapsulation layer 208 are the same encapsulation layer.

Figure 11:
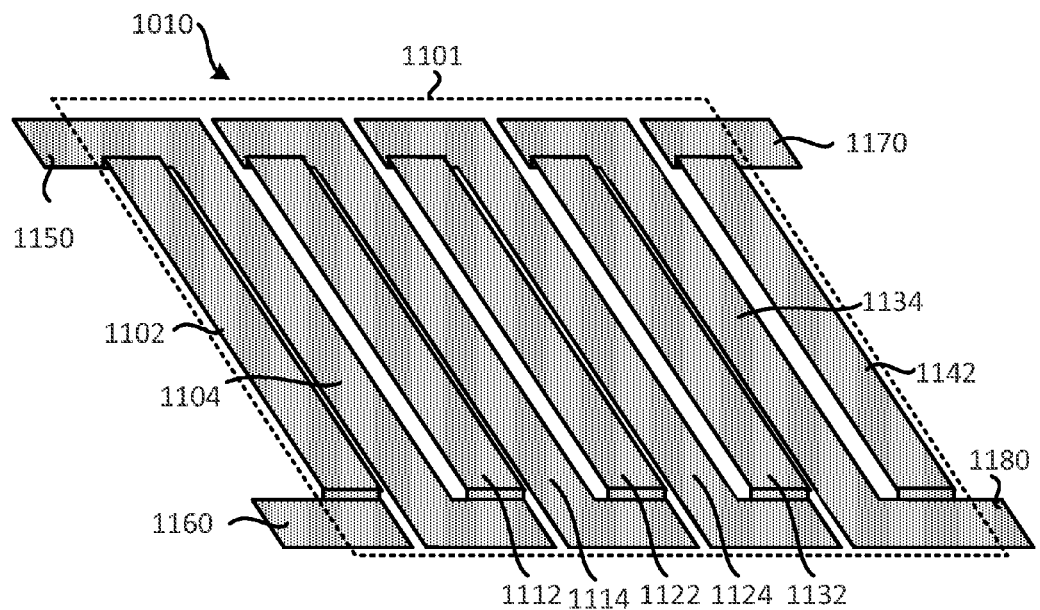
FIG. 11 illustrates an angled view of a conductive sheet configured as an inductor.

FIG. 11 illustrates an angled view of the sheet 1010. The sheet 1010 may be one or more sheets comprising an electrically conductive material formed or configured to operate as an inductor. The sheet 1010 may have a thickness of about 11 microns (μm) or less in some implementations. The sheet 1010 may include an inductive portion 1101. The inductive portion 1101 of the sheet 1010 may be configured to operate as an inductor (e.g., inductive means). In some implementations, the inductive portion 1101 of the sheet 1010 may be configured to operate as a solenoid inductor (e.g., solenoid inductive means).

The inductive portion 1101 includes a first sheet portion 1102, a second sheet portion 1104, a third sheet portion 1112, a fourth sheet portion 1114, a fifth sheet portion 1122, a sixth sheet portion 1124, a seventh sheet portion 1132, an eighth sheet portion 1134, and a ninth sheet portion 1142. In some implementations, some or all of the first sheet portion 1102, the second sheet portion 1104, the third sheet portion 1112, the fourth sheet portion 1114, the fifth sheet portion 1122, the sixth sheet portion 1124, the seventh sheet portion 1132, the eighth sheet portion 1134, and/or the ninth sheet portion 1142 are formed and/or configured to operate as an inductor (e.g., solenoid inductor).

The first sheet portion 1102 is coupled to the second sheet portion 1104. The second sheet portion 1104 is coupled to the third sheet portion 1112. The third sheet portion 1112 is coupled to the fourth sheet portion 1114. The fourth sheet portion 1114 is coupled to the fifth sheet portion 1122. The fifth sheet portion 1122 is coupled to the sixth sheet portion 1124. The sixth sheet portion 1124 is coupled to the seventh sheet portion 1132. The seventh sheet portion 1132 is coupled to the eighth sheet portion 1134. The eighth sheet portion 1134 is coupled to the ninth sheet portion 1142.

The first sheet portion 1102, the third sheet portion 1112, the fifth sheet portion 1122, the seventh sheet portion 1132, and the ninth sheet portion 1142 may be formed by a first level (e.g., upper level, raised level) of the sheet 1010. The second sheet portion 1104, the fourth sheet portion 1114, the sixth sheet portion 1124, and the eighth sheet portion 1134 are formed by a second level (e.g., lower level) of the sheet 1010.

The first sheet portion 1102 and the second sheet portion 1104 may form a first winding of an inductor. The third sheet portion 1112 and the fourth sheet portion 1114 may form a second winding of the inductor. The fifth sheet portion 1122 and the sixth sheet portion 1124 may form a third winding of the inductor. The seventh sheet portion 1132 and the eighth sheet portion 1134 may form a fourth winding of the inductor.

FIG. 11 also illustrates that the sheet 1010 includes a first terminal portion 1150, a second terminal portion 1160, a third terminal portion 1170, and a fourth terminal portion 1180. The first terminal portion 1150 and the second terminal portion 1160 may be coupled to the first sheet portion 1102. The third terminal portion 1170 and the fourth terminal portion 1180 may be coupled to the ninth sheet portion 1142. In some implementations, one or more of the terminal portions of the sheet 1010 may be coupled to a via in an encapsulation layer. For example, the second terminal portion 1160 of the sheet 1010 may be coupled to the via 1020 in the encapsulation layer 208.

Figure 12:
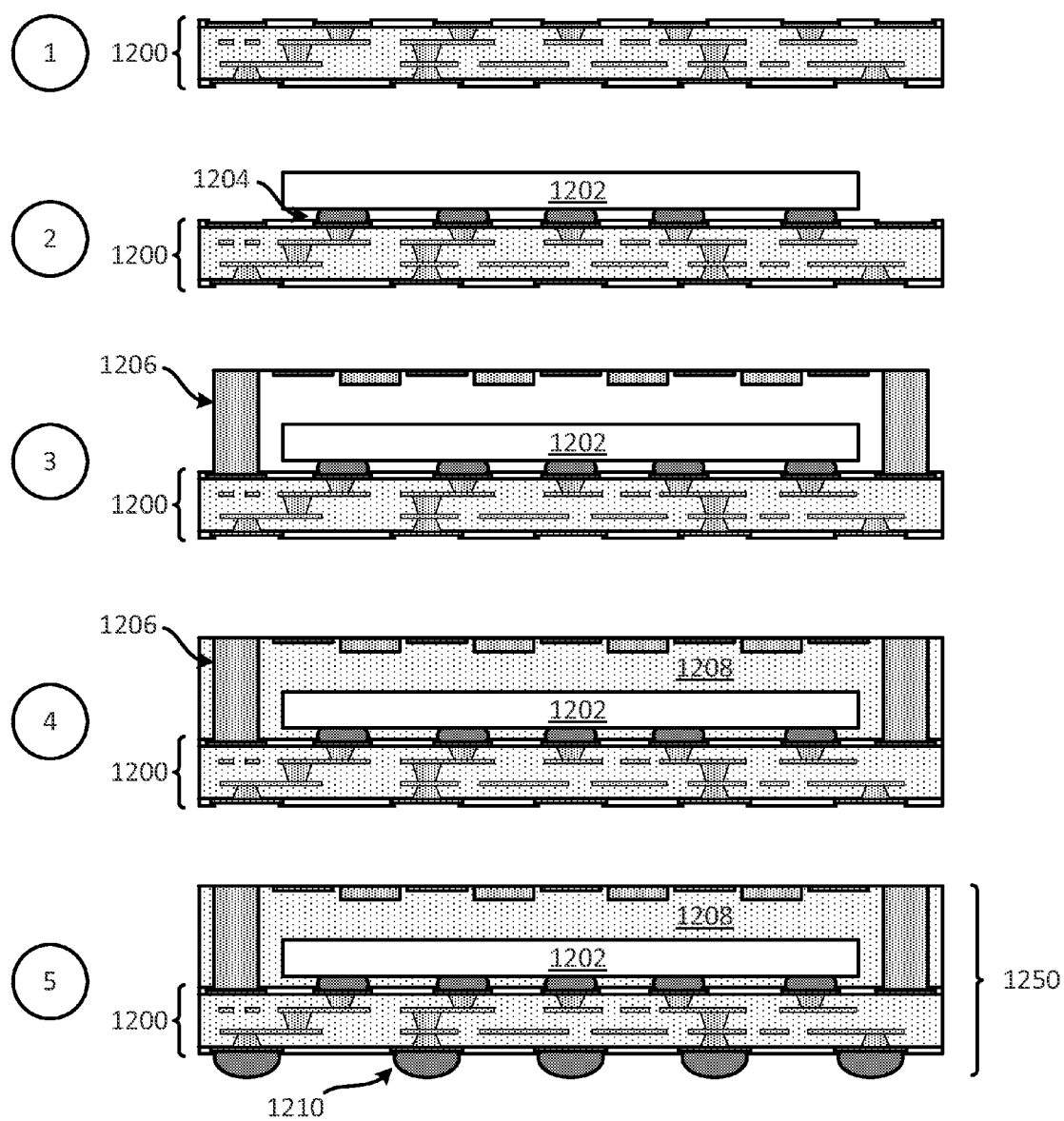
FIG. 12 illustrates an exemplary sequence for providing/fabricating an integrated device package that includes a conductive sheet configured as an inductor in an encapsulation layer.

Exemplary Sequence for Providing/Fabricating an Integrated Device Package Comprising Sheet of Conductive Material Configured as an Inductor In some implementations, providing/fabricating an integrated device package that includes a conductive sheet configured to operate as an inductor in an encapsulation layer includes several processes. FIG. 12 illustrates an exemplary sequence for providing/fabricating an integrated device package that includes a conductive sheet configured to operate as an inductor in an encapsulation layer. In some implementations, the sequence of FIG. 12 may be used to provide/fabricate the integrated device package of FIG. 2 and/or other integrated device packages in the present disclosure. However, for the purpose of simplification, FIG. 12 will be described in the context of fabricating the integrated device package of FIG. 2.

It should be noted that the sequence of FIG. 12 may combine one or more stages in order to simplify and/or clarify the sequence for providing an integrated device package. In some implementations, the order of the processes may be changed or modified.

Stage 1 illustrates a state after a substrate 1200 is provided. In some implementations, the substrate 1200 is provided by a supplier. In some implementations, the substrate 1200 is fabricated (e.g., formed). The substrate 1200 may be a package substrate and/or an interposer. The substrate 1200 includes at least one dielectric layer, a set of interconnects (e.g., traces, pads, vias), and/or a solder resist layer. In some implementations, the substrate 1200 is similar to the substrate 202 of FIG. 2.

Stage 2 illustrates a state after a die 1202 is coupled to the substrate 1200. As shown in stage 2, the die 1202 is coupled to (e.g., mounted) the substrate 1200 through a set of solder balls 1204. However, the die 1202 may be coupled to the substrate 1200 differently.

Stage 3 illustrates a state after a sheet 1206 is coupled to the substrate 1200. The sheet 1206 may include one or more sheets of electrically conductive material formed and/or configured to operate as an inductor. The sheet 1206 may be similar to the sheet 206, the sheet 800, and/or any sheet formed to operate as an inductor, described in the present disclosure. In some implementations, an electrically conductive bonding material is used to couple the sheet 1206 to the substrate 1200. The sheet 1206 may be coupled to interconnects (e.g., pads) of the substrate 1200.

Stage 4 illustrates a state after an encapsulation layer 1208 is formed on the substrate 1200, the die 1202, and the sheet 1206. In some implementations, the encapsulation layer 1208 at least partially encapsulates the sheet 1206.

Stage 5 illustrates a state after a set of solder balls 1210 is coupled to the substrate 1200. In some implementations, stage 5 illustrates an integrated device package 1250 that includes a sheet that includes an electrically conductive material, where at least a portion of the sheet is formed and/or configured to operate as an inductor. In some implementations, the inductor is a solenoid inductor. In some implementations, the integrated device package 1250 is similar to the integrated device package 200.

Figure 13:
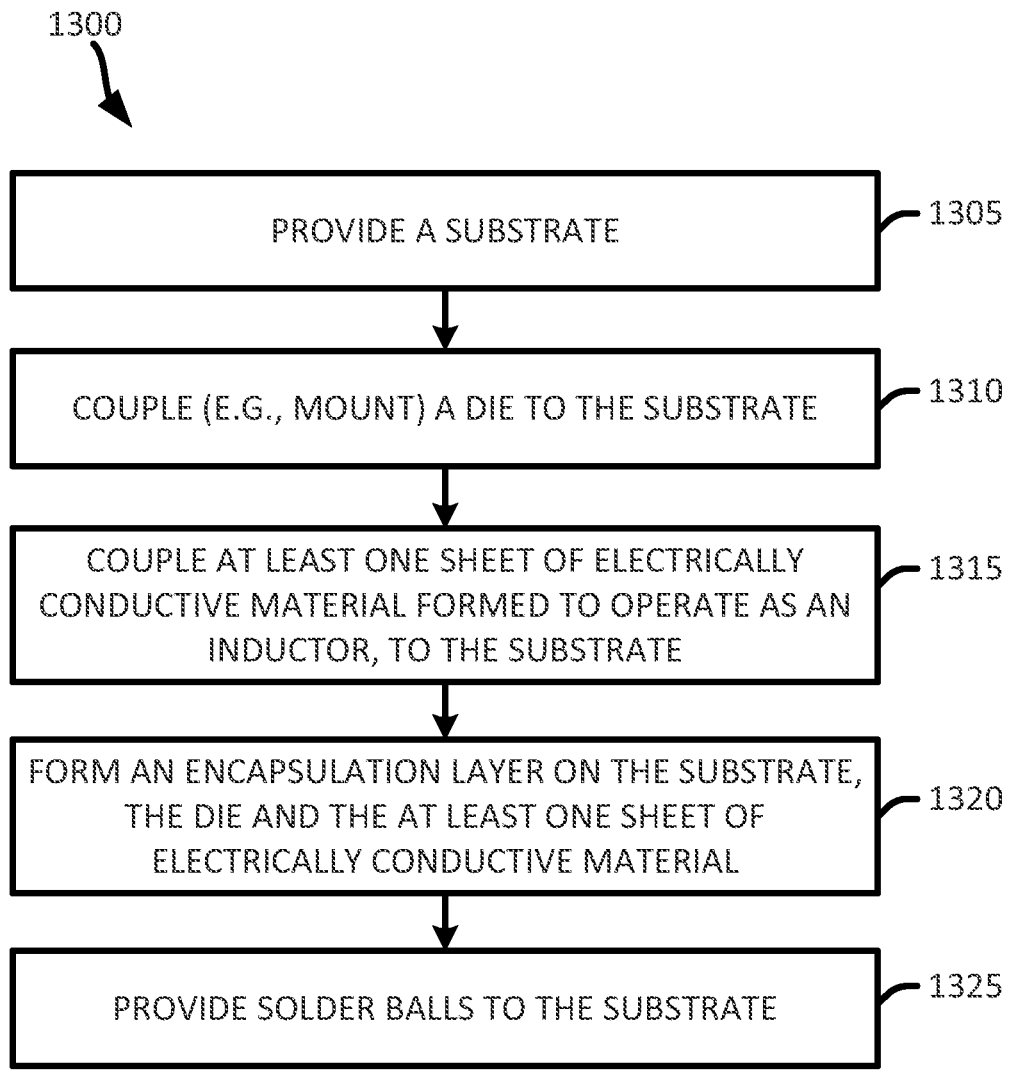
FIG. 13 illustrates an exemplary flow diagram of a method for providing/fabricating an integrated device package that includes a conductive sheet configured as an inductor in an encapsulation layer.

Exemplary Method for Providing/Fabricating an Integrated Device Package Comprising Sheet of Conductive Material Configured as an Inductor FIG. 13 illustrates an exemplary flow diagram of a method 1300 for providing/fabricating an integrated device package that includes a conductive sheet configured to operate as an inductor in an encapsulation layer. In some implementations, the method of FIG. 13 may be used to provide/fabricate the integrated device package of FIG. 2 and/or other integrated device package in the present disclosure.

It should be noted that the flow diagram of FIG. 13 may combine one or more step and/or processes in order to simplify and/or clarify the method for providing an integrated device package. In some implementations, the order of the processes may be changed or modified.

The method provides (at 1305) a substrate. In some implementations, the substrate is provided by a supplier. In some implementations, the substrate is fabricated (e.g., formed). The substrate may be a package substrate and/or an interposer. The substrate includes a dielectric layer, a set of interconnects (e.g., traces, pads, vias), and/or a solder resist layer. In some implementations, the substrate is similar to the substrate 202 of FIG. 2.

The method couples (at 1310) a die to the substrate. In some implementations, the die is coupled to (e.g., mounted) the substrate through a set of solder balls. However, the die may be coupled to the substrate differently.

The method couples (at 1315) a sheet to the substrate. For example, the sheet may be coupled to interconnects (e.g., pads) to the substrate. The sheet may include one or more sheets of electrically conductive material formed to operate as an inductor. The sheet may be similar to the sheet 206, the sheet 800, and/or any sheet formed and/or configured to operate as an inductor (e.g., solenoid inductor), as described in the present disclosure. In some implementations, an electrically conductive bonding material is used to couple the sheet to the substrate.

The method forms (at 1320) an encapsulation layer on the substrate, the die, and the sheet. In some implementations, the encapsulation layer at least partially encapsulates the sheet.

The method provides (at 1325) a set of solder balls on the substrate.

Figure 14A:
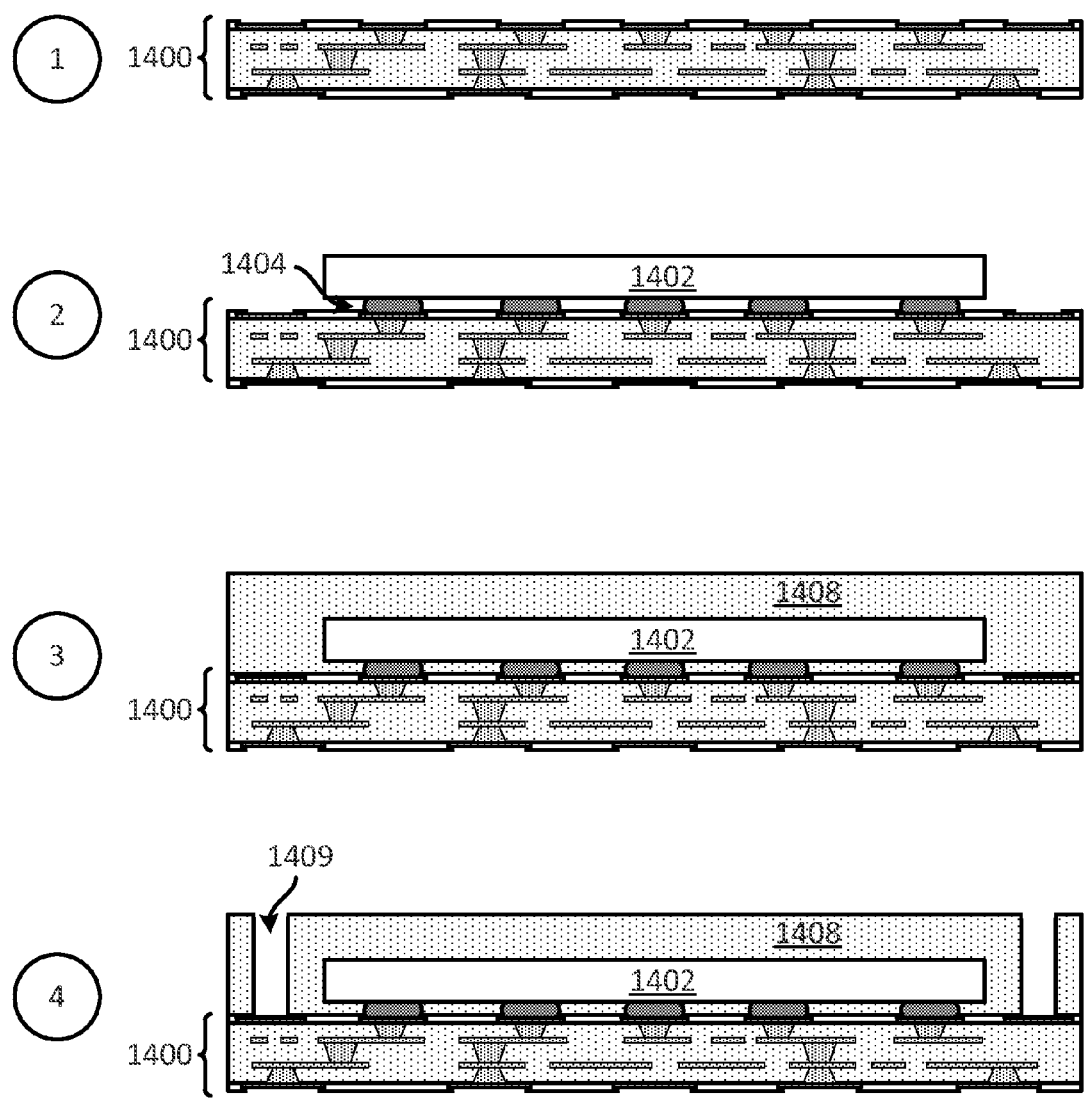
FIG. 14 (comprising FIGS. 14A-14B) illustrates an exemplary sequence for providing/fabricating an integrated device package that includes a conductive sheet configured as an inductor in an encapsulation layer.
Figure 14B:
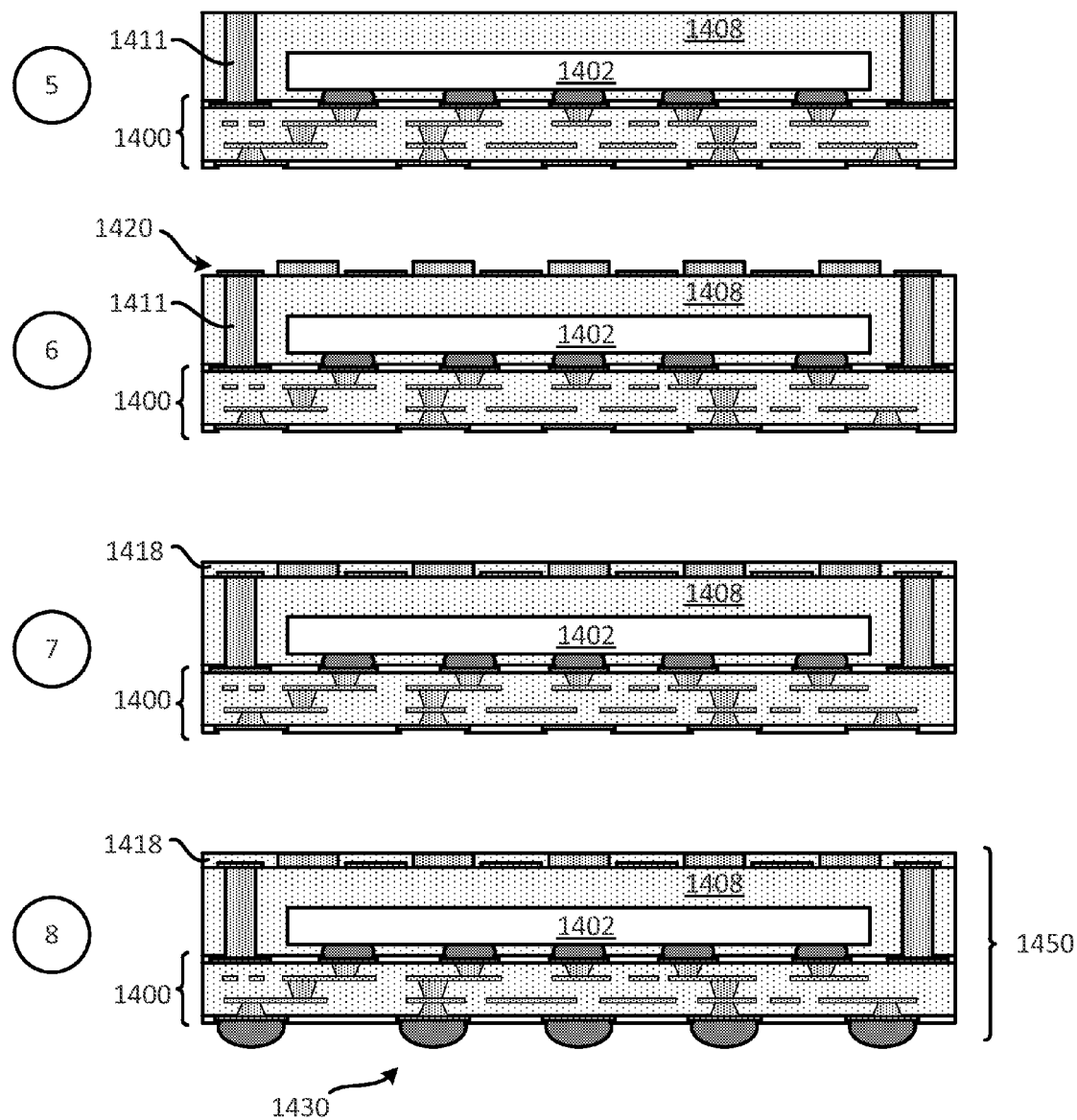

Exemplary Sequence for Providing/Fabricating an Integrated Device Package Comprising Sheet of Conductive Material Configured as an Inductor FIG. 14 (which includes FIGS. 14A-14B) illustrates another exemplary sequence for providing/fabricating an integrated device package that includes a conductive sheet configured to operate as an inductor in an encapsulation layer. In some implementations, the sequence of FIGS. 14A-14B may be used to provide/fabricate the integrated device package of FIG. 10 and/or other integrated device packages in the present disclosure. However, for the purpose of simplification, FIGS. 14A-14B will be described in the context of fabricating the integrated device package of FIG. 10.

It should be noted that the sequence of FIGS. 14A-14B may combine one or more stages in order to simplify and/or clarify the sequence for providing an integrated device package. In some implementations, the order of the processes may be changed or modified.

Stage 1, as shown in FIG. 14A, illustrates a state after a substrate 1400 is provided. In some implementations, the substrate 1400 is provided by a supplier. In some implementations, the substrate 1400 is fabricated (e.g., formed). The substrate 1400 may be a package substrate and/or an interposer. The substrate 1400 includes a dielectric layer, a set of interconnects (e.g., traces, pads, vias), and/or a solder resist layer. In some implementations, the substrate 1400 is similar to the substrate 202 of FIG. 10.

Stage 2 illustrates a state after a die 1402 is coupled to the substrate 1400. As shown in stage 2, the die 1402 is coupled to the substrate 1400 through a set of solder balls 1404. However, the die 1402 may be coupled to the substrate 1400 differently.

Stage 3 illustrates a state after an encapsulation layer 1408 (e.g., first encapsulation layer) is formed on the substrate 1400 and the die 1402. In some implementations, the encapsulation layer 1408 is a photo-lithographable material. The encapsulation layer 1408 may be a mold and/or epoxy fill.

Stage 4 illustrates a state after at least one cavity 1409 is formed in the encapsulation layer 1408. Different implementations may form the cavity 1409 differently. In some implementations, the cavity 1409 may be formed through a laser etching process and/or a photo-lithography process.

Stage 5, as shown in FIG. 14B, illustrates a state after at least one via 1411 in the encapsulation layer 1408 is formed. The via 1411 is formed in the cavity 1409. The via 1411 may be a through encapsulation via. The via 1411 may be formed through a plating process. Various examples of plating processes are described in FIGS. 17-18.

Stage 6 illustrates a state after a sheet 1420 is provided on the encapsulation layer 1408 and coupled to at least one via 1411. In some implementations, an electrically conductive bonding material is used to couple the sheet 1420 to the via 1411. The sheet 1420 may include one or more sheets of electrically conductive material formed and/or configured to operate as an inductor (e.g., solenoid inductor).

The sheet 1420 may be similar to the sheet 1010 and/or any sheet formed and/or configured to operate as an inductor (e.g., solenoid inductor), as described in the present disclosure.

Stage 7 illustrates a state after an encapsulation layer 1418 (e.g., second encapsulation layer) is provided. The encapsulation layer 1418 is provided such that the encapsulation layer 1418 at least partially encapsulates the sheet 1420. In some implementations, the encapsulation layer 1418 is the same as the encapsulation layer 1408.

Stage 8 illustrates a state after a set of solder balls 1430 is coupled to the substrate 1400. In some implementations, stage 8 illustrates an integrated device package 1450 that includes a sheet that includes an electrically conductive material, where at least a portion of the sheet is formed to operate as an inductor. In some implementations, the inductor is a solenoid inductor. In some implementations, the integrated device package 1450 is similar to the integrated device package 1000.

Figure 15:
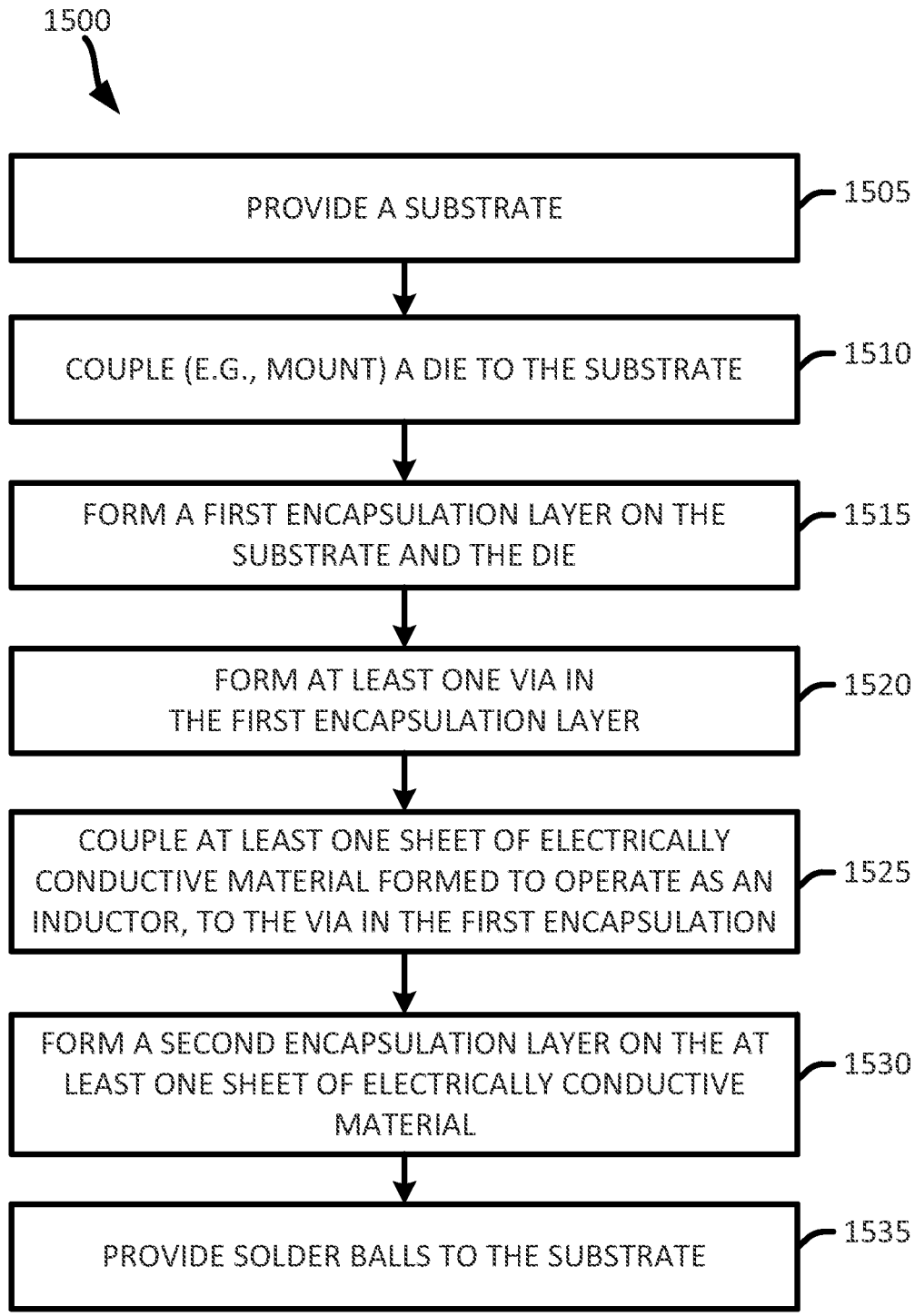
FIG. 15 illustrates an exemplary flow diagram of a method for providing/fabricating an integrated device package that includes a conductive sheet configured as an inductor in an encapsulation layer.

Exemplary Method for Providing/Fabricating an Integrated Device Package Comprising Sheet of Conductive Material Configured as an Inductor FIG. 15 illustrates an exemplary flow diagram of a method 1300 for providing/fabricating an integrated device package that includes a conductive sheet configured to operate as an inductor in an encapsulation layer. In some implementations, the method of FIG. 15 may be used to provide/fabricate the integrated device package of FIG. 10 and/or other integrated device package in the present disclosure.

It should be noted that the flow diagram of FIG. 15 may combine one or more step and/or processes in order to simplify and/or clarify the method for providing an integrated device package. In some implementations, the order of the processes may be changed or modified.

The method provides (at 1505) a substrate. In some implementations, the substrate is provided by a supplier. In some implementations, the substrate is fabricated (e.g., formed). The substrate may be a package substrate and/or an interposer. The substrate includes a dielectric layer, a set of interconnects (e.g., traces, pads, vias), and/or a solder resist layer. In some implementations, the substrate is similar to the substrate 202 of FIG. 10.

The method couples (at 1510) a die to the substrate. In some implementations, the die is coupled to the substrate through a set of solder balls. However, the die may be coupled to the substrate differently.

The method forms (at 1515) a first encapsulation layer on the substrate and the die. The first encapsulation layer may include a litho-patternable material.

The method forms (at 1520) at least one via in the first encapsulation layer. The via vertically traverses the first encapsulation layer. The via may be a through encapsulation via. The via may be coupled to an interconnect (e.g., pad) of the substrate. The via may be formed through a plating process. Various examples of plating processes are described in FIGS. 17-18.

The method couples (at 1525) a sheet to the via in the first encapsulation layer. In some implementations, an electrically conductive bonding material is used to couple the sheet to the via. The sheet may include one or more sheets of electrically conductive material formed and/or configured to operate as an inductor (e.g., solenoid inductor). The sheet may be the sheet 1010, and/or any sheet formed to operate as an inductor, as described in the present disclosure.

The method forms (at 1530) a second encapsulation layer on the sheet and the first encapsulation layer. In some implementations, the second encapsulation layer at least partially encapsulates the sheet. In some implementations, the second encapsulation layer is the same as the first encapsulation layer.

The method provides (at 1535) a set of solder balls on the substrate.

Exemplary Conductive Sheet Formed to Operate as an Inductor

Different implementations may provide a sheet formed to operate as an inductor with different shapes, configurations, and/or arrangements. FIGS. 3, 8 and 11 illustrate non-limiting examples of sheets with different inductor portions, designs, configurations, and arrangements.

Figure 16:
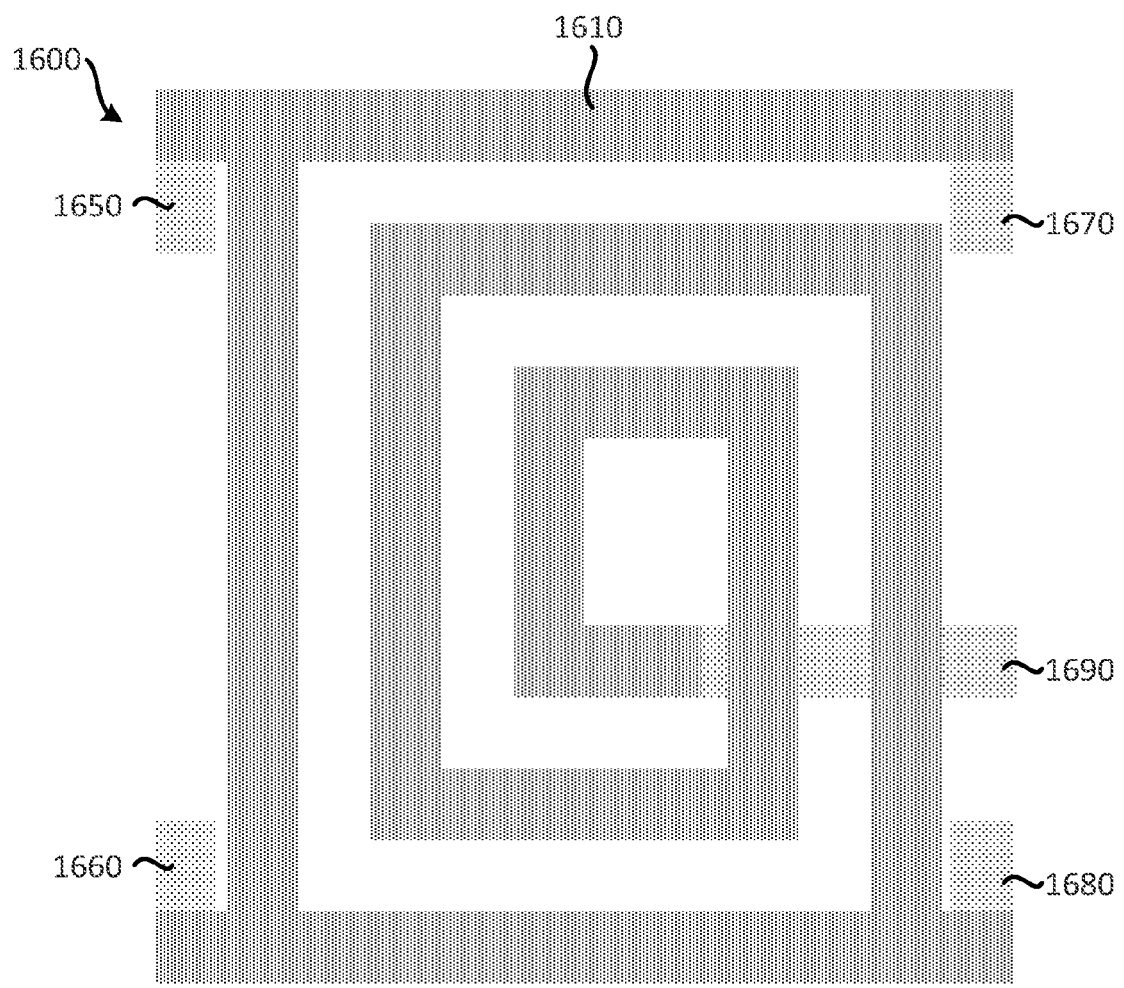
FIG. 16 illustrates a plan view (e.g., top view) of a conductive sheet configured as an inductor.

FIG. 16 illustrates a plan view of another sheet 1600 with a different inductor design. The sheet 1600 includes an inductive portion 1610, a first terminal portion 1650, a second terminal portion 1660, a third terminal portion 1670, a fourth terminal portion 1680, and a fifth terminal portion 1690. The inductive portion 1610 is located on a first level of the sheet 1600. As shown in FIG. 16, the inductive portion 1610 has a spiral like shape. In some implementations, the inductive portion 1610 is formed and/or configured to operate as a spiral inductor. The first terminal portion 1650, the second terminal portion 1660, the third terminal portion 1670, the fourth terminal portion 1680, and the fifth terminal portion 1690 are located on a second level (e.g., lower level) of the sheet 1600. The sheet 1600 may include one or more sheets.

Exemplary Semi-Additive Patterning (SAP) Process

Various interconnects (e.g., traces, vias, pads) are described in the present disclosure. These interconnects may be formed in the substrate, the encapsulation layer, and/or the integrated device package. In some implementations, these interconnects may includes one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes. These plating processes are described being formed in or on a dielectric layer. However, in some implementations, these plating processes may be formed in or on an encapsulation layer.

Different implementations may use different processes to form and/or fabricate the metal layers (e.g., interconnects, redistribution layer, under bump metallization layer). In some implementations, these processes include a semi-additive patterning (SAP) process and a damascene process. These various different processes are further described below.

Figure 17:
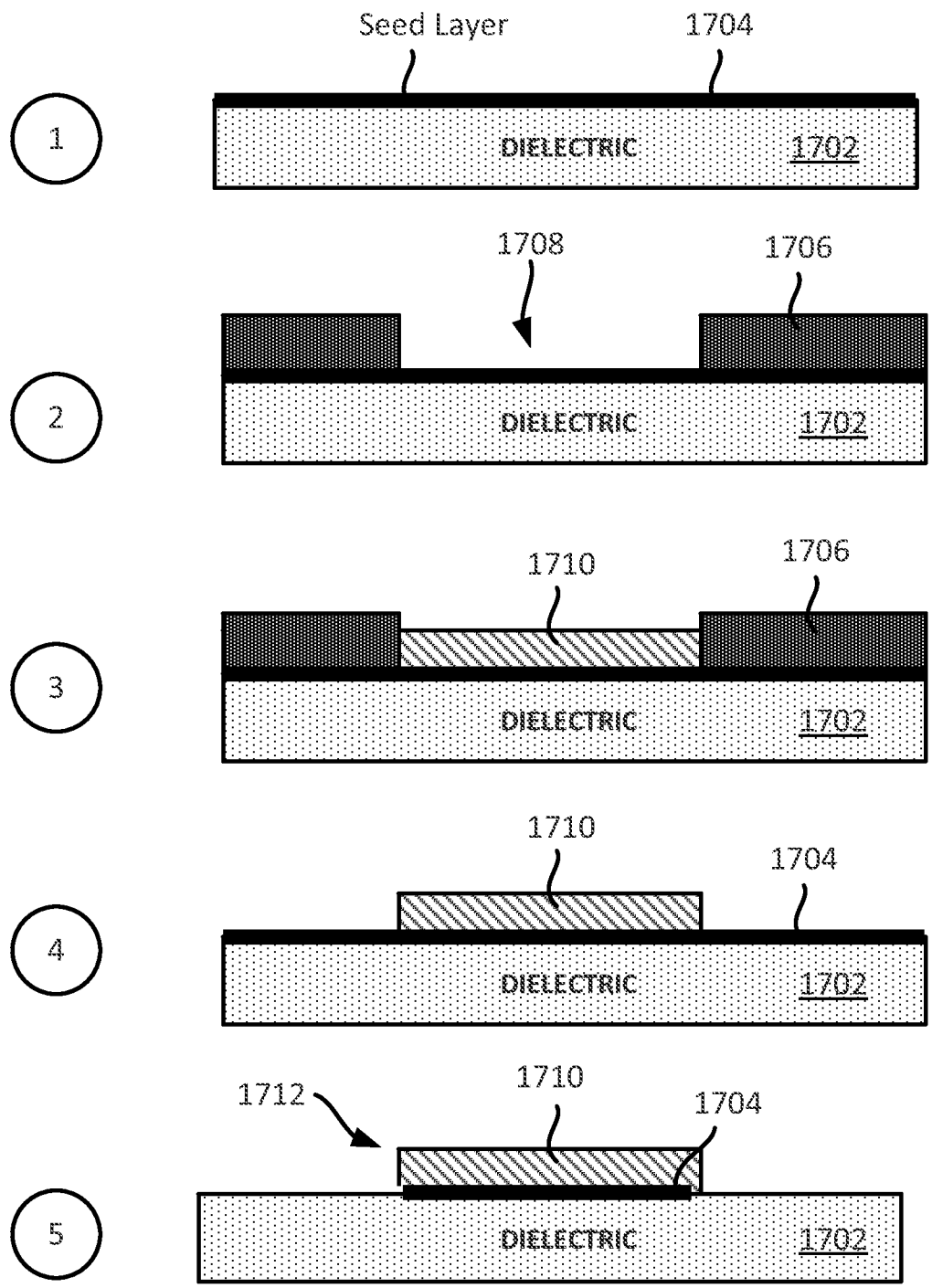
FIG. 17 illustrates an example of a semi-additive patterning (SAP) process.

FIG. 17 illustrates a sequence for forming an interconnect using a semi-additive patterning (SAP) process to provide and/or form an interconnect in one or more dielectric layer(s) and/or encapsulation layer. As shown in FIG. 17, stage 1 illustrates a state of an integrated device (e.g., substrate) after a dielectric layer 1702 is provided (e.g., formed). In some implementations, stage 1 illustrates that the dielectric layer 1702 includes a first metal layer 1704. The first metal layer 1704 is a seed layer in some implementations. In some implementations, the first metal layer 1704 may be provided (e.g., formed) on the dielectric layer 1702 after the dielectric layer 1702 is provided (e.g., received or formed). Stage 1 illustrates that the first metal layer 1704 is provided (e.g., formed) on a first surface of the dielectric layer 1702. In some implementations, the first metal layer 1704 is provided by using a deposition process (e.g., PVD, CVD, plating process).

Stage 2 illustrates a state of the integrated device after a photo resist layer 1706 (e.g., photo develop resist layer) is selectively provided (e.g., formed) on the first metal layer 1704. In some implementations, selectively providing the resist layer 1706 includes providing a first resist layer 1706 on the first metal layer 1704 and selectively removing portions of the resist layer 1706 by developing (e.g., using a development process). Stage 2 illustrates that the resist layer 1706 is provided such that a cavity 1708 is formed.

Stage 3 illustrates a state of the integrated device after a second metal layer 1710 is formed in the cavity 1708. In some implementations, the second metal layer 1710 is formed over an exposed portion of the first metal layer 1704. In some implementations, the second metal layer 1710 is provided by using a deposition process (e.g., plating process).

Stage 4 illustrates a state of the integrated device after the resist layer 1706 is removed. Different implementations may use different processes for removing the resist layer 1706.

Stage 5 illustrates a state of the integrated device after portions of the first metal layer 1704 are selectively removed. In some implementations, one or more portions of the first metal layer 1704 that is not covered by the second metal layer 1710 is removed. As shown in stage 5, the remaining first metal layer 1704 and the second metal layer 1710 may form and/or define an interconnect 1712 (e.g., trace, vias, pads) in an integrated device and/or a substrate. In some implementations, the first metal layer 1704 is removed such that a dimension (e.g., length, width) of the first metal layer 1704 underneath the second metal layer 1710 is about the same or smaller than a dimension (e.g., length, width) of the second metal layer 1710, which can result in an undercut, as shown at stage 5 of FIG. 17. In some implementations, the above mentioned processes may be iterated several times to provide and/or form several interconnects in one or more dielectric layers of an integrated device and/or substrate.

Exemplary Damascene Process

Figure 18:
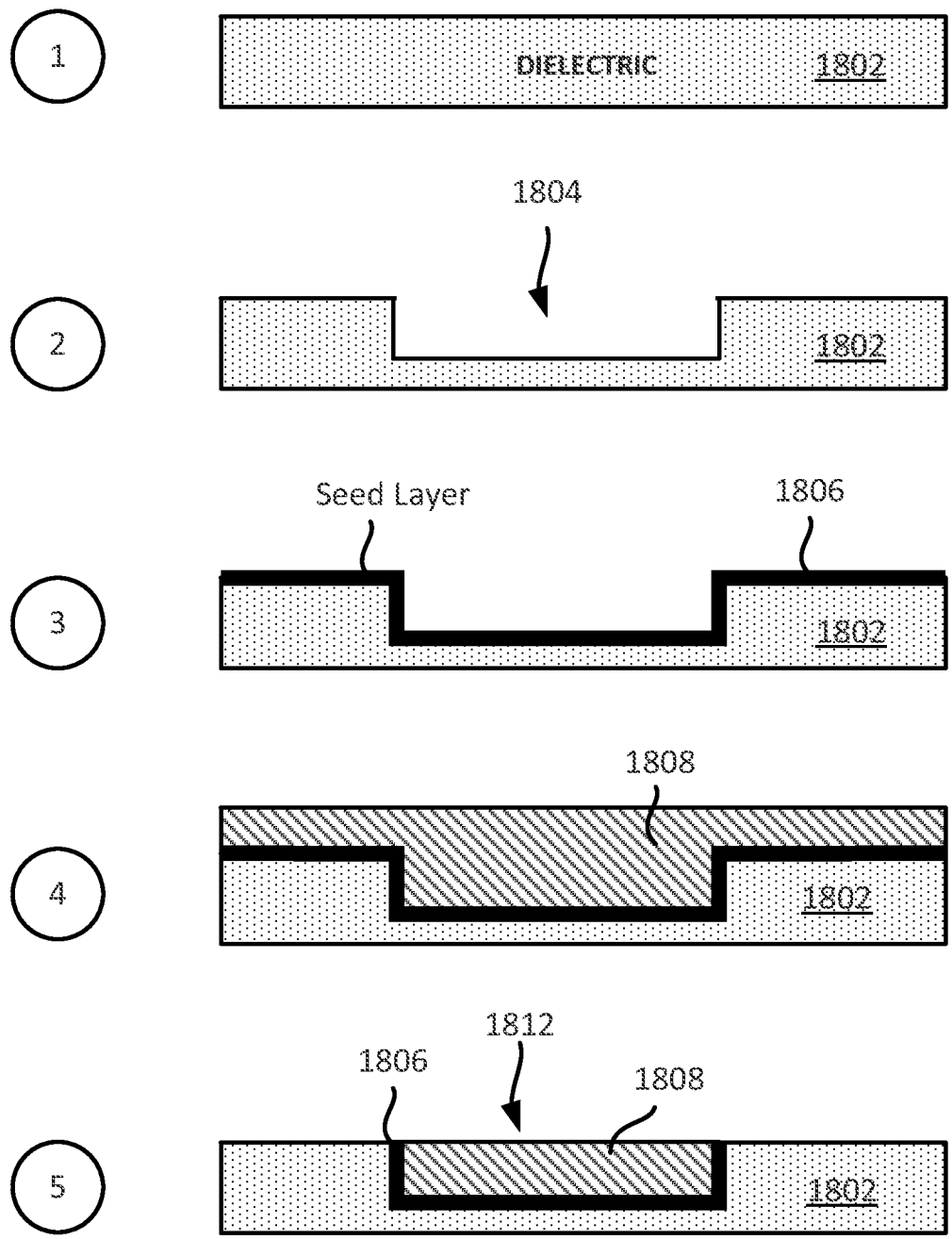
FIG. 18 illustrates an example of a damascene process.

FIG. 18 illustrates a sequence for forming an interconnect using a damascene process to provide and/or form an interconnect in a dielectric layer and/or an encapsulation layer. As shown in FIG. 18, stage 1 illustrates a state of an integrated device after a dielectric layer 1802 is provided (e.g., formed). In some implementations, the dielectric layer 1802 is an inorganic layer (e.g., inorganic film).

Stage 2 illustrates a state of an integrated device after a cavity 1804 is formed in the dielectric layer 1802. Different implementations may use different processes for providing the cavity 1804 in the dielectric layer 1802.

Stage 3 illustrates a state of an integrated device after a first metal layer 1806 is provided on the dielectric layer 1802. As shown in stage 3, the first metal layer 1806 provided on a first surface of the dielectric layer 1802. The first metal layer 1806 is provided on the dielectric layer 1802 such that the first metal layer 1806 takes the contour of the dielectric layer 1802 including the contour of the cavity 1804. The first metal layer 1806 is a seed layer in some implementations. In some implementations, the first metal layer 1806 is provided by using a deposition process (e.g., physical vapor deposition (PVD), Chemical Vapor Deposition (CVD) or plating process).

Stage 4 illustrates a state of the integrated device after a second metal layer 1808 is formed in the cavity 1804 and a surface of the dielectric layer 1802. In some implementations, the second metal layer 1808 is formed over an exposed portion of the first metal layer 1806. In some implementations, the second metal layer 1808 is provided by using a deposition process (e.g., plating process).

Stage 5 illustrates a state of the integrated device after the portions of the second metal layer 1808 and portions of the first metal layer 1806 are removed. Different implementations may use different processes for removing the second metal layer 1808 and the first metal layer 1806. In some implementations, a chemical mechanical planarization (CMP) process is used to remove portions of the second metal layer 1808 and portions of the first metal layer 1806. As shown in stage 5, the remaining first metal layer 1806 and the second metal layer 1808 may form and/or define an interconnect 1812 (e.g., trace, vias, pads) in an integrated device and/or a substrate. As shown in stage 5, the interconnect 1812 is formed in such a way that the first metal layer 1806 is formed on the base portion and the side portion(s) of the second metal layer 1810. In some implementations, the cavity 1804 may include a combination of trenches and/or holes in two levels of dielectrics so that via and interconnects (e.g., metal traces) may be formed in a single deposition step, In some implementations, the above mentioned processes may be iterated several times to provide and/or form several interconnects in one or more dielectric layers of an integrated device and/or substrate.

Exemplary Electronic Devices

Figure 19:
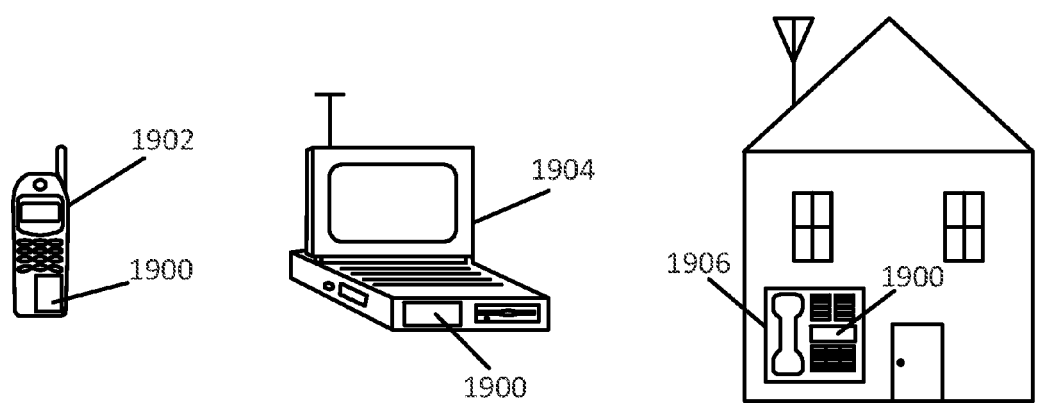
FIG. 19 illustrates various electronic devices that may integrate an integrated device package, a semiconductor device, a die, an integrated circuit and/or PCB described herein.

FIG. 19 illustrates various electronic devices that may be integrated with any of the aforementioned integrated device, semiconductor device, integrated circuit, die, interposer, package or package-on-package (PoP). For example, a mobile phone 1902, a laptop computer 1904, and a fixed location terminal 1906 may include an integrated device 1900 as described herein. The integrated device 1900 may be, for example, any of the integrated circuits, dice, packages, package-on-packages described herein. The devices 1902, 1904, 1906 illustrated in FIG. 19 are merely exemplary. Other electronic devices may also feature the integrated device 1900 including, but not limited to, mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13, 14A-14B, 15, 16, 17, 18 and/or 19 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11, 12, 13, 14A-14B, 15, 16, 17, 18 and/or 19 and its corresponding description in the present disclosure is not limited to dies and/or ICs. In some implementations, FIGS. 2, 3, 4, 5, 6, 7, 8, 9, 10, 11, 12, 13, 14A-14B, 15, 16, 17, 18 and/or 19 and its corresponding description may be used to manufacture, create, provide, and/or produce integrated devices. In some implementations, a device may include a die, a die package, an integrated circuit (IC), an integrated device, an integrated device package, a wafer, a semiconductor device, a package on package structure, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device package comprising:
   a package substrate;
   a die coupled to the package substrate;
   an encapsulation layer encapsulating the die; and
   at least one sheet of electrically conductive material configured to operate as an inductor, wherein the at least one sheet of electrically conductive material is at least partially encapsulated by the encapsulation layer; and wherein the at least one sheet of electrically conductive material comprises:
   a first sheet portion;
   a second sheet portion coupled to the first sheet portion and substantially parallel to the first sheet portion, wherein the first sheet portion and the second sheet portion form a first winding of the inductor.

2. The device package of claim 1, wherein the at least one sheet of electrically conductive material is configured to operate as a solenoid inductor.

3. The device package of claim 1, further comprising a via in the encapsulation layer, wherein the via is coupled to the package substrate and the at least one sheet of electrically conductive material.

4. The device package of claim 1, wherein the at least one sheet of electrically conductive material further comprises:
   a first terminal portion coupled to the first sheet portion; and
   a second terminal portion coupled to the second sheet portion.

5. The device package of claim 4, wherein the first sheet portion is formed on a first level of the at least one sheet, and the second sheet portion is formed on a second level of the at least one sheet.

6. The device package of claim 1, wherein the at least one sheet of electrically conductive material further comprises:
   a third sheet portion coupled to the second sheet portion;
   a fourth sheet portion coupled to the third sheet portion, wherein the third sheet portion and the fourth sheet portion form a second winding of the inductor;
   a first terminal portion coupled to the first sheet portion; and
   a second terminal portion coupled to the fourth sheet portion.

7. The device package of claim 1, wherein the inductor has an aperture ratio of about 1:2 or less.

8. The device package of claim 1, wherein the at least one sheet of electrically conductive material is coupled to the package substrate through an electrically conductive bonding material.

9. The device package of claim 1, wherein the encapsulation layer is at least one of a mold and/or an epoxy fill.

10. The device package of claim 1, wherein the device package is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, and a laptop computer, and further including the device.

11. A method for fabricating a device package, comprising:
   providing a package substrate;
   coupling a die to the package substrate;

coupling at least one sheet of electrically conductive material to the package substrate, wherein the at least one sheet of electrically conductive material is formed to operate as an inductor; and wherein the at least one sheet of electrically conductive material comprises:
  a first sheet portion;
  a second sheet portion coupled to the first sheet portion and substantially parallel to the first sheet portion, wherein the first sheet portion and the second sheet portion form a first winding of the inductor; and
  forming an encapsulation layer that at least partially encapsulates the die and the at least one sheet of electrically conductive material.

12. The method of claim 11, wherein the at least one sheet of electrically conductive material is formed to operate as a solenoid inductor.

13. The method of claim 11, further comprising forming a via in the encapsulation layer, wherein the via is formed to be coupled to the at least one sheet of electrically conductive material.

14. The method of claim 11, wherein the at least one sheet of electrically conductive material further comprises:
  a first terminal portion coupled to the first sheet portion; and
  a second terminal portion coupled to the second sheet portion.

15. The method of claim 14, wherein the first sheet portion is formed on a first level of the at least one sheet, and the second sheet portion is formed on a second level of the at least one sheet.

16. The method of claim 11, wherein the at least one sheet of electrically conductive material further comprises:
  a third sheet portion coupled to the second sheet portion;
  a fourth sheet portion coupled to the third sheet portion, wherein the third sheet portion and the fourth sheet portion form a second winding of the inductor;
  a first terminal portion coupled to the first sheet portion; and
  a second terminal portion coupled to the fourth sheet portion.

17. The method of claim 11, wherein the inductor has an aperture ratio of about 1:2 or less.

18. The method of claim 11, wherein coupling the at least one sheet of electrically conductive material to the package substrate comprises using an electrically conductive bonding material to couple the at least one sheet of electrically conductive material to the package substrate.

19. The method of claim 11, wherein the encapsulation layer is at least one of a mold and/or an epoxy fill.

20. The method of claim 11, wherein the integrated device package is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, and a laptop computer, and further including the device.

* * * * *